United States Patent
Chen et al.

(10) Patent No.: US 11,942,307 B2
(45) Date of Patent: Mar. 26, 2024

(54) PLASMA PROCESSING WITH RADIO FREQUENCY (RF) SOURCE AND BIAS SIGNAL WAVEFORMS

(71) Applicant: Tokyo Electron Limited, Tokyo (JP)

(72) Inventors: Zhiying Chen, Austin, TX (US);
Barton Lane, Tokyo (JP); Yun Han, Albany, NY (US); Peter Lowell George Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 182 days.

(21) Appl. No.: 17/451,094

(22) Filed: Oct. 15, 2021

(65) Prior Publication Data
US 2023/0117812 A1 Apr. 20, 2023

(51) Int. Cl.
*H01J 37/32* (2006.01)

(52) U.S. Cl.
CPC . *H01J 37/32174* (2013.01); *H01J 2237/3341* (2013.01)

(58) Field of Classification Search
CPC .......... H01J 37/32091; H01J 37/32128; H01J 37/32137; H01J 37/32146; H01J 37/32174
See application file for complete search history.

(56) References Cited

U.S. PATENT DOCUMENTS

| | | | |
|---|---|---|---|
| 5,928,528 A * | 7/1999 | Kubota | H01J 37/32706 257/E21.252 |
| 8,288,741 B1 * | 10/2012 | Miller | H01J 37/32082 313/363.1 |
| 9,583,357 B1 * | 2/2017 | Long | H01J 37/32128 |
| 9,831,074 B2 | 11/2017 | Lee et al. | |
| 9,966,231 B2 | 5/2018 | Boswell et al. | |
| 10,998,169 B2 | 5/2021 | Ventzek et al. | |
| 2015/0325413 A1 | 11/2015 | Kim et al. | |
| 2020/0168437 A1 | 5/2020 | Ziemba et al. | |
| 2021/0193438 A1 * | 6/2021 | Dorf | H05H 1/46 |
| 2021/0407769 A1 * | 12/2021 | Kim | H01J 37/32146 |

FOREIGN PATENT DOCUMENTS

| | | |
|---|---|---|
| JP | 2016540115 A | 12/2016 |
| WO | 2020037331 A1 | 2/2020 |

OTHER PUBLICATIONS

Hebner, G. A., "Spatially resolved, excited state densities and neutral and ion temperatures in inductively coupled argon plasmas," J. Appl. Phys. 80 (5), Sep. 1, 1996, 14 pages.
International Search Report and Written Opinion, PCT Application No. PCT/US2022/040424, dated Nov. 29, 2022, 13 pages.

\* cited by examiner

*Primary Examiner* — Tung X Le
(74) *Attorney, Agent, or Firm* — Slater Matsil, LLP

(57) ABSTRACT

A method for plasma processing includes: sustaining a plasma in a plasma processing chamber, the plasma processing chamber including a first radio frequency (RF) electrode and a second RF electrode, where sustaining the plasma includes: coupling an RF source signal to the first RF electrode; and coupling a bias signal between the first RF electrode and the second RF electrode, the bias signal having a bipolar DC (B-DC) waveform including a plurality of B-DC pulses, each of the B-DC pulses including: a negative bias duration during which the pulse has negative polarity relative to a reference potential, a positive bias duration during which the pulse has positive polarity relative to the reference potential, and a neutral bias duration during which the pulse has neutral polarity relative to the reference potential.

17 Claims, 11 Drawing Sheets

PLASMA PROCESSING WITH RADIO FREQUENCY (RF) SOURCE AND BIAS SIGNAL WAVEFORMS

TECHNICAL FIELD

The present invention relates generally to plasma processing, and, in particular embodiments, to a systems and methods for plasma processing with radio frequency (RF) source and bipolar-DC bias signal waveforms.

BACKGROUND

Generally, an integrated circuit (IC) is fabricated by sequentially depositing and patterning layers of dielectrics, metals, and semiconductors over a substrate to form a network of electronic components connected by metal lines and vias, all integrated into one monolithic structure. Enabled by advances in photolithography and three-dimensional (3D) devices, such as the gate-all-around field-effect transistor (GAAFET) and 3D NAND memory, the component density is doubled about every two years, to reduce a cost per function of the IC. Plasma processes, such as plasma-enhanced atomic layer deposition (PEALD), high aspect ratio contact (HARC) etch, and selective deposition are often used in fabricating 3D devices with nanoscale features, thus, challenging plasma technology to provide atomic scale control over a wide range of metrics such as edge profile, roughness, anisotropy, uniformity, conformality, and selectivity of selective deposition. Plasma process metrics depend on plasma properties such as, ion energy and ion angle distributions, ion and radical densities, and radical-to-ion flux ratio. Properties of plasma and the chemical environment at the surface and in deep trenches are influenced by RF signals used to sustain plasma during processing. Hence, further innovation in RF signal waveform generation would benefit the precision and control of plasma processing.

SUMMARY

A method for plasma processing includes: sustaining a plasma in a plasma processing chamber, the plasma processing chamber including a first radio frequency (RF) electrode and a second RF electrode, where sustaining the plasma includes: coupling an RF source signal to the first RF electrode; and coupling a bias signal between the first RF electrode and the second RF electrode, the bias signal having a bipolar DC (B-DC) waveform including a plurality of B-DC pulses, each of the B-DC pulses including: a negative bias duration during which the pulse has negative polarity relative to a reference potential, a positive bias duration during which the pulse has positive polarity relative to the reference potential, and a neutral bias duration during which the pulse has neutral polarity relative to the reference potential.

A system for plasma processing including: a plasma processing chamber including: a first radio frequency (RF) electrode; a second RF electrode; and a substrate holder configured to hold a semiconductor substrate in the plasma processing chamber; a processor; a non-transitory memory storing a program to be executed in the processor, the program including: instructions to couple an RF source signal to the first RF electrode; and instructions to couple a bias signal between the first RF electrode and the second RF electrode, the bias signal having a bipolar DC (B-DC) waveform including a plurality of B-DC pulses, each of the B-DC pulses including: a negative bias duration during which the pulse has negative polarity relative to a reference potential, a positive bias duration during which the pulse has positive polarity relative to the reference potential, and a neutral bias duration during which the pulse has neutral polarity relative to the reference potential.

A method for plasma processing includes: sustaining a plasma in a plasma processing chamber, the plasma processing chamber including a first radio frequency (RF) electrode and a second RF electrode, where sustaining the plasma includes: coupling an RF source signal to the first RF electrode; and coupling a bias signal between the first RF electrode and the second RF electrode, the bias signal having a bipolar DC (B-DC) waveform being a difference of a first unipolar DC (U-DC) waveform and a second unipolar DC waveform, the polarity of the first U-DC waveform being same as the polarity of the second U-DC waveform, and where coupling the bias signal includes: coupling a first U-DC signal to the first RF electrode, the first U-DC signal having the first U-DC waveform including a first plurality of U-DC pulses, where each of the first plurality of U-DC pulses includes: a first U-DC pulse width during which the pulse has a first bias polarity relative to a reference potential; and a first U-DC pulse separation time during which the pulse has a neutral bias polarity substantially equal to the reference potential; coupling a second U-DC signal to the second RF electrode, the second U-DC signal having the second U-DC waveform including a second plurality of U-DC pulses, where each of the second plurality of U-DC pulses includes: a second U-DC pulse width during which the pulse has the first bias polarity relative to the reference potential and; a second U-DC pulse separation time during which the pulse has a neutral bias polarity substantially equal to the reference potential; and synchronizing the first U-DC signal with the second U-DC signal, where the synchronizing is delaying the U-DC pulses of the first U-DC signal by a constant U-DC delay time from the U-DC pulses of the second U-DC signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
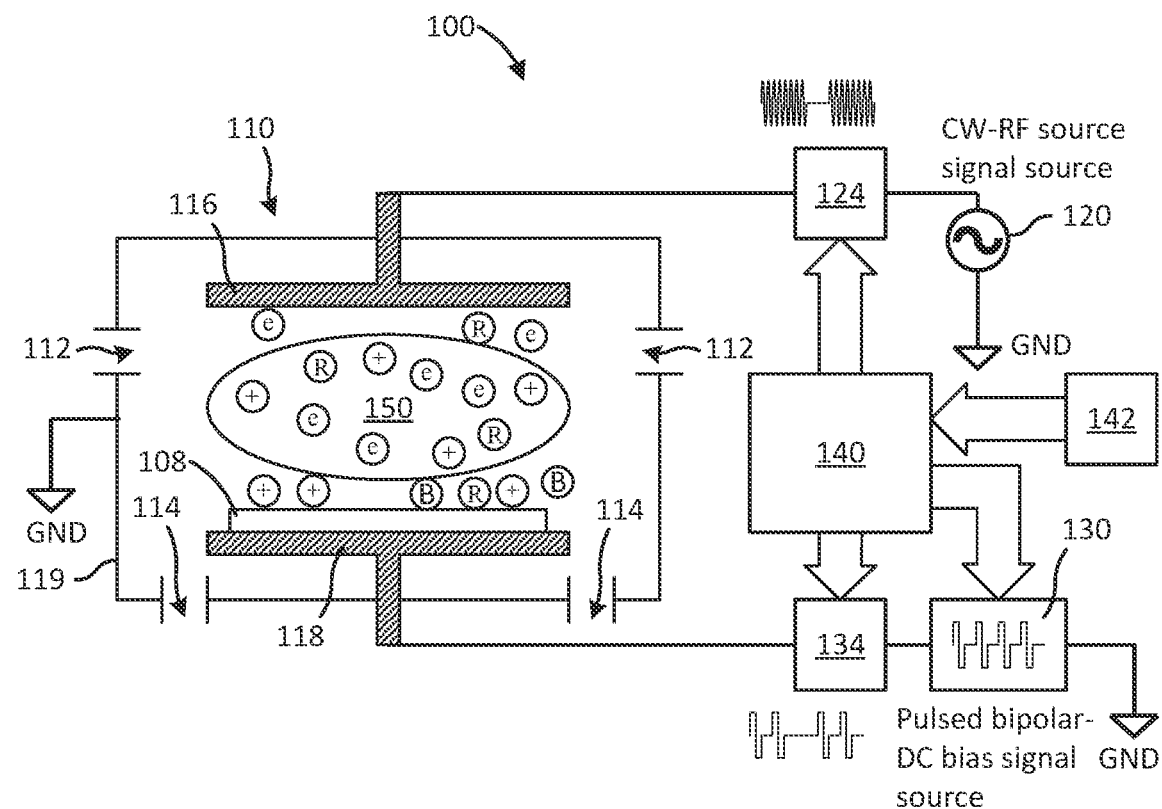
FIG. 1 is a schematic of a plasma processing system, in accordance with some embodiments.

The present disclosure is related to systems and methods for plasma processing of semiconductor substrates. Characteristics of the plasma and the plasma process depend on the characteristics of two electrical signals, known as a radio frequency (RF) source signal and a bias signal, that are generally used to ignite and sustain plasma in a plasma processing chamber. This disclosure describes example embodiments of plasma processing systems and methods where plasma is ignited and sustained by coupling parameterized RF source and time-varying bias signals to RF electrodes of a plasma processing chamber. The plasma processing system includes a processor that executes a program with instructions to configure the system, the program being stored in memory included in the system. On executing the program, the processor sends commands to a timing controller, providing timing parameters selected for adjusting and synchronizing the RF source and bias signal waveforms. With the timing parameters, the timing controller may send appropriate control signals to synchronously control the output signals of electronic equipment that generate the RF source and bias signals coupled to the RF electrodes of the plasma processing chamber. By adjusting and synchronizing the RF source and bias signal waveforms, the timing controller may tune the plasma environment at the surface of the substrate, including the surface inside deep trenches.

The example embodiments in this disclosure use RF source signals having either a continuous wave RF (CW-RF) waveform or an RF-burst waveform comprising a train of RF-burst pulses. Each RF-burst pulse has an RF waveform (e.g., an RF sinusoid) that is present during an RF-burst duration of the RF-burst pulse. The RF-burst duration is followed by an RF-burst separation time during which there is no RF source signal. A sum of the RF-burst duration and the RF-burst separation time is one period of the RF-burst waveform, referred to as the RF-burst period. The RF-burst period may be about 1 microsecond to about 10 milliseconds long.

The time-varying bias signals have pulsed bipolar-DC waveforms, referred to as B-DC waveforms in this disclosure. The B-DC waveform comprises a high-frequency train of B-DC pulses that include DC pulses of positive and negative polarity, as well as durations of neutral polarity. The various polarities are relative to a reference potential of the RF system defined to be equal to 0 V. The reference potential may be the ground potential or ground. Each B-DC pulse of the pulse train is parameterized with three timing parameters: a negative bias duration (during which the pulse has negative polarity), a positive bias duration (during which the pulse is of positive polarity), and a neutral bias duration (during which the pulse is of neutral polarity). In some embodiments, a fourth timing parameter may be introduced by splitting the neutral bias duration into a first neutral bias pulse segment and a second neutral bias pulse segment separating the negative and positive bias durations, as explained in further detail below. One cycle of the B-DC pulse, which is a sum of the three (or four) timing parameters, may be about 100 nanoseconds to about 400 microseconds long. The B-DC waveform of the bias signal may be a continuous B-DC waveform comprising a continuous train of B-DC pulses or, a B-DC-burst waveform comprising a train of B-DC-burst pulses. Each B-DC-burst pulse comprises a plurality of consecutive B-DC pulses that is present during a B-DC-burst duration followed by a B-DC-burst separation time during which there is no bias signal, a sum of the B-DC-burst duration and the B-DC-burst separation time being one B-DC-burst period. As explained in further detail below, the RF-burst period has to be equal to the B-DC-burst period, and is referred to as burst period in this disclosure.

An embodiment of the plasma processing system will first be described with FIG. 1. Alternate embodiments of the plasma processing system will be described with FIGS. 5A-5B. Alternative embodiments of waveforms of RF source signals and pulsed bipolar-DC (B-DC) bias signals will be described with FIGS. 2A-2D. Alternative embodiments of B-DC waveforms of bias signals used in conjunction with continuous wave (CW) RF waveforms of RF source signals will be described with FIGS. 3A-3D. Alternative embodiments of B-DC waveforms of bias signals used in conjunction with RF-burst waveforms of RF source signals will be described with FIGS. 4A-4C.

FIG. 1 is a schematic of a plasma processing system 100 comprising a plasma processing chamber 110, a CW-RF source signal source 120, a continuous B-DC bias signal source 130, a timing controller 140, and a processor 142. The CW-RF source signal source 120 and the continuous B-DC bias signal source 130 may be programmable. The timing controller 140 is configured to receive commands from a processor 142 which, when executed, programs the continuous B-DC bias signal source 130 to generate B-DC pulses with the selected timing parameters received from the processor 142. The signals from the RF source signal source 120 and the continuous B-DC bias signal source 130 are routed through a first chopper 124 and a second chopper 134, respectively, which may be programmable. The first and second choppers 124 and 134 may be programmed by the timing controller 140 to either transmit an incoming signal unmodulated, or modulate the incoming signal with a pulsed gating signal and transmit the modulated signal. The gating signal, generated in the respective first and second choppers 124 and 134, periodically allows the incoming signal to pass through (directly couples input to output) during a burst duration and blocks the signal (decouples output from input) during a burst separation time, a sum of the burst time and the burst separation time being a burst period. A first gating signal in the first chopper 124 and a second gating signal in the second chopper 134 have the same burst period, and the two gating signals are synchronously staggered by a constant burst delay. Synchronizing the B-DC-burst waveform with the RF-burst waveform delays the B-DC-burst pulses by a constant burst delay from the RF-burst pulses. The burst delay is used to synchronize the superposition of the RF-burst waveform and the B-DC-burst waveform in the plasma processing chamber 110. The two burst times, the burst period, and the burst delay are specified in commands sent to the timing controller 140 by a processor 142 of the plasma processing system 100, as indicated by a block arrow directed towards the timing controller 140 in FIG. 1. The timing controller executes the instructions to synchronously control an output signal of the first chopper 124, an output signal of the second chopper 134, and an output signal of the continuous B-DC bias signal source 130, as indicated by two block arrows directed from the timing controller 140 to each of the first and second choppers 124 and 134 and a fourth angled block arrow from the timing controller 140 to the continuous B-DC bias signal source 130.

In some embodiments, the CW-RF source signal source 120 may be a low-power source and may be combined with a signal generator such as the programmable chopper 124 into one unit. The signal generator produces a low power signal by switching the CW-RF signal using control signals received from the timing controller 140. The low power signal would then be amplified to full power by an RF power amplifier (not shown in FIG. 1). The amplifier may also be combined with the low-power RF source and the signal generator into one unit.

Generally, a plasma processing chamber comprises two RF electrodes that may be configured to couple to an RF source signal and/or a bias signal transmitted from outside the plasma processing chamber. An outer wall of a plasma processing chamber typically has a conductive portion coupled to the reference potential (or ground) of the RF system and may be referred to as a ground electrode of the plasma processing chamber. The RF source signal, the bias signal, and the reference potentials relative to which the signals are generated are transmitted to the plasma processing chamber. The RF source signal and the bias signal are coupled to the RF electrodes and the reference potentials are coupled to the ground electrode of the plasma processing chamber. For example, if two coaxial cables are being used to couple the RF source signal and bias signal to the plasma chamber 110 in FIG. 1 then each of the two inner conductors of the coaxial cables may be connected to either a top RF electrode 116 or a bottom RF electrode 118. The two outer conductors may be connected to a conductive portion 119 of the outer wall of the plasma chamber 110.

The RF source signal may be coupled to a first RF electrode and the bias signal may be coupled between the first RF electrode and a second RF electrode. As mentioned above, in the embodiments described in this disclosure, the bias signals have B-DC waveforms. There are several configurations that may be used to couple the bias signal between the first RF electrode and the second RF electrode, where the RF source is coupled to the first RF electrode. In one embodiment, the bias signal having the B-DC waveform is coupled to the first RF electrode, and the second RF electrode is coupled to the reference potential. In another embodiment, the bias signal having the B-DC waveform is coupled to the second RF electrode. In yet another embodiment, the bias signal having the B-DC waveform is a difference of a first unipolar DC (U-DC) signal and a second U-DC signal. In this embodiment, the first U-DC signal is coupled to the first RF electrode and the second U-DC signal is coupled to the second RF electrode. As explained in further detail below, the selected timing parameters of the B-DC waveform may be achieved by selecting appropriate pulse widths and pulse separation times of the two U-DC signals, along with synchronizing the first U-DC signal with the second U-DC signal by delaying the U-DC pulses of the first U-DC signal by a constant U-DC delay time from the U-DC pulses of the second U-DC signal.

The plasma processing chamber 110 in FIG. 1 is a vacuum chamber configured as capacitively coupled plasma (CCP) chamber. A CCP chamber may comprise two disc-shaped RF electrodes disposed on opposite sides inside the plasma processing chamber, each RF electrode having a flat surface facing the opposite RF electrode. In the example configuration illustrated in FIG. 1, the top RF electrode 116 is coupled to the RF source signal and the bottom RF electrode 118 is coupled to the bias signal. The reference potential (indicated by GND in FIG. 1) is coupled to the ground electrode of the plasma processing chamber 110, which is the conductive portion 119 of the outer wall.

The CCP configuration is selected by example only; some other configuration such as inductively coupled plasma (ICP) may also be used. In the ICP configuration, the RF source signal is coupled to an RF electrode (referred to as an ICP antenna) that is physically separated from the plasma by a thick dielectric window. RF source power is coupled to plasma from the ICP antenna outside the plasma chamber. In some embodiment, the pulsed bipolar-DC waveforms may be used for plasma formed using microwave power instead of RF power.

The plasma processing chamber 110 in FIG. 1 is configured with gas inlets 112 and exhausts 114 coupled to a gas flow system. As known to persons skilled in the art, the gas flow system comprises gas canisters, valves, and vacuum pumps maintaining the flow of the low-pressure gaseous mixture through the plasma processing chamber 110. A mixture of process and carrier gases, referred to as feed gas, is introduced through the inlets 112 and flows through the plasma processing chamber 110. The ambient inside the plasma processing chamber 110 is, generally, maintained at a low pressure and a relatively low temperature compared to typical furnace temperatures, for example, room temperature. The pressure in plasma processing chamber 110 is typically from about 1 mTorr to about 1 Torr but, some plasma processes may be performed at high pressure (e.g., atmospheric pressure).

As the feed gas gets exposed to the electromagnetic fields generated at RF electrodes 116 and 118, a small fraction of the gas molecules may be ionized and form plasma, often referred to as weakly ionized plasma, between the electrodes.

In a CCP chamber, (e.g., plasma processing chamber 110) energy is transferred from the RF source and bias signals to plasma (e.g., plasma 150) by capacitive coupling between the plasma and the RF electrodes. The plasma is also coupled to ground by an impedance of the capacitance between plasma (e.g., plasma 150) and a ground electrode of the plasma chamber (e.g., the conductive portion 119 of the outer wall). As mentioned above, the RF source signal may be a CW-RF or an RF-burst waveform transmitted from the first chopper 124. Likewise, the bias signal transmitted from the second chopper 134 may be a continuous B-DC pulse train or have a B-DC-burst waveform. The bottom RF electrode 118 in plasma processing chamber 110 may be included in a substrate holder (e.g., an electrostatic chuck) holding a substrate 108, for example, a semiconductor substrate. In some embodiments, a conductive bulk of the substrate 108 is physically separated from the bottom RF electrode 118 by a dielectric layer. In some embodiments, the substrate holder (e.g., an electrostatic chuck) may include a dielectric layer between the bottom RF electrode 118 and the surface of the substrate holder in contact with the back side of the substrate 108.

The feed gas is generally charge neutral and in thermal equilibrium at a temperature, T, equal to the ambient temperature in the plasma processing chamber 110. A portion of the energy imparted to the feed gas dissociates a fraction of the neutral gas molecules and atoms into net neutral, weakly ionized plasma comprising positively charged ions (indicated by "+") and negatively charged free electrons (indicated by "e") of plasma 150, as illustrated schematically in FIG. 1. Further energy may be transferred from the electromagnetic fields to the mobile charged particles as kinetic energy. As explained further below, in general, the kinetic energy has a random component (due to randomizing collisions between the various particles) and a directed component in the direction of an accelerating electric field. The random component may be dominant in a region of low electric field and high frequency of collisions, and the directed component (in the direction of the electric force) may be dominant in a region of high electric field and low frequency of collisions.

In addition to generating charged ions and free electrons, a portion of the energy imparted to the feed gas generates neutral radicals (indicated by "R" in FIG. 1). A neutral radical is a charge-neutral group of atoms (or an atom) that has unpaired electrons. Because of the presence of unpaired electrons, radicals have high chemical reactivity.

Initially, the average kinetic energy per particle of all types of particles is roughly equal to its thermal equilibrium value of $(3/2) k_B T$, where T is the ambient temperature in kelvin and $k_B$ is the Boltzmann constant. For example, at room temperature, or 300 K, the average kinetic energy of each particle of the feed gas is 39 meV. Once ionized, the charged particles may be accelerated and acquire kinetic energy from the electric field, the acquired energy being an excess kinetic energy. Although the acceleration is directed parallel to the electric field, the momentum gained from the electric field is rapidly scattered in all possible directions because of random collisions with various particles (mostly neutral particles in weakly ionized plasma). Hence, much of the kinetic energy acquired from the electric field in the bulk of the plasma is transferred toward increasing the random component of kinetic energy. For each species of charged particle (ion and electron), the average value of its random component of kinetic energy may be equivalently represented by a respective non-equilibrium effective temperature: an electron temperature, $T_e$, and an ion temperature, $T_{ion}$. During an initial transient, the effective temperature rises from its initial thermal equilibrium value, T. An increasing energy in excess of the thermal equilibrium value results in an increasing frequency of inelastic collisions till a steady state is established where the excess energy acquired from the electric field is balanced by a loss of excess energy in inelastic collisions. The steady state value of the effective temperature depends on the frequency of inelastic collisions. The collision frequency depends on a probability of inelastic collisions (collisions causing significant energy loss) averaged over the ensemble of particles of the respective species (e.g., free electrons or ions). A lower frequency of inelastic collisions results in a higher effective temperature at which steady state is established. Most of the collisions between free electrons and neutral particles are roughly elastic collisions (negligible energy loss), whereas ions almost always lose energy in collisions (e.g., collisions between an ion and a neutral particle). Accordingly, $T_e$ is generally much higher than $T_{ion}$. The preferential increase in kinetic energy of free electrons is more pronounced at low pressure. Hence, in plasma 150 in FIG. 1, a non-equilibrium steady-state may be established by collisions, in which the random component of the average kinetic energy of an ion is not much higher than that for gas molecules at T=300 K, whereas the randomized average kinetic energy of a free electron may be 100 times higher (e.g., from about 1 eV to about 10 eV). As explained further below, the ions may acquire a high directed kinetic energy (e.g., from about 50 eV to about 1000 eV) as they pass through a region of high electric field before striking the substrate in a plasma process such as sputtering and anisotropic reactive ion etch (RIE) processes, where ions are used to bombard a surface.

Generally, the bulk of the plasma, where most of the ions and free electrons are concentrated, is a wide central quasi-neutral region, where the electric field is low because of screening by mobile charges. The quasi-neutral region is surrounded by a depleted and narrow space-charge region of high electric field, known as a plasma sheath. Ordinarily, mobility and diffusivity of the free electrons are much higher than that of the ions. With the positively charged ions being much slower than the negatively charged free electrons, free electrons near the periphery get lost faster from the plasma leaving behind a net positive charge which creates the sheaths around the central quasi-neutral region. The charge distribution in the sheath establishes an electric field in a direction that pushes free electrons back towards the quasi-neutral region and accelerates ions outward toward the conductive portion 119 and strike the chamber wall and the substrate 108. Generally, the charge density and the electric field in the sheath is high relative to the charge density and the electric field in the quasi-neutral region.

In the quasi-neutral region, there is a small electric field (small relative to the electric field in the sheath), referred to as the ambipolar electric field, that arises to equilibrate the flow of ions and free electrons to maintain a steady state charge density distribution. Ions and free electrons acquire momentum and kinetic energy from the ambipolar electric field. However, the directed component of the excess momentum and energy is small: the ions and free electrons move randomly in all possible directions colliding relatively frequently with various particles, particularly the large number of neutral particles in weakly ionized plasma. In other words, the distribution of ions and free electrons vs. angle is roughly uniform. Furthermore, because of randomizing collisions, the distribution in energy may be approximated by a Maxwell-Boltzmann distribution function with an elevated temperature representing the non-equilibrium average kinetic energy. Energy balance is achieved mostly by the charged particles (e.g., free electrons and ions) losing energy to the neutral particles in inelastic collisions. The neutral particles are not accelerated by the electric fields; hence remain at a cooler temperature very close to the thermal equilibrium value, T. As explained above, both electrons and ions equilibrate to their respective elevated effective temperatures, $T_e$ and $T_{ion}$, according to their respective rates of energy loss through inelastic collisions. Typically, $T_e \gg T_{ion}$ with a ratio of $(T_e/T_{ion})>10$.

Plasma processing is generally performed by physically bombarding an exposed surface of the substrate with a fluence of energetic ions and/or by chemically reacting radicals produced in the plasma, present in the feed gas, and in the substrate material, depending on the plasma process. The physical and chemical interactions may produce volatile byproducts (indicated by "B" in FIG. 1) that are pumped out of the plasma processing chamber 110 through the exhausts 114.

Although only a small fraction of the neutral feed gas particles are ionized in weakly ionized plasma, the ions and free electrons are indispensable to plasma processing. Collisions between neutral gas molecules and highly energetic free electrons at the higher energy side of the Maxwell-Boltzmann distribution play a major role in generating radicals and ions in the quasi-neutral region of plasma 150 by dissociating and ionizing feed gas molecules. Low energy "cold" ions from the quasi-neutral region are energized as they enter the narrow plasma sheath close to the substrate and acquire directed kinetic energy from the electric field of the sheath. The ion energy, determined mainly by the potential difference across the sheath, assists radicals to chemically react with other radicals in the gas (e.g., in a chemical vapor deposition (CVD) process) and with the substrate material. Over time, the flow of ions to the substrate may result in undesirable positive charge accumulation. In addition to the role of generating radicals and ions, the negatively charged free electrons may be used to neutralize the positive charge buildup, as explained further below.

In this disclosure, methods of plasma processing with innovative RF source signal and B-DC bias signal waveforms are described. Electromagnetic fields, hence the RF source signal and B-DC bias signal waveforms, directly influence the flow and the energy of charged particles in plasma (e.g., free electrons and ions). The effects of the RF source signal and B-DC bias signal waveforms on the neutral species (e.g., the neutral radicals and the byproducts of the chemical and physical interactions) are achieved indirectly through the timing and synchronization of the pulses. For example, in some embodiments, plasma 150 in the plasma chamber 110 may be extinguished periodically for durations of about 1 microsecond to about 1 millisecond, and re-ignited to prevent accumulation and re-deposition of reaction byproducts, as described in further detail below. In some embodiment, a neutral bias duration may be adjusted in a range of about 100 nanosecond to about 1 millisecond to achieve a desired ratio of radical fluence to ion fluence to ensure that a sufficient density of radicals are present to react with material sputtered from the substrate by ion bombardment. The neutral bias duration also allows time to replenish the ions extracted from the plasma by the electric field in the sheath.

As defined above, the neutral bias duration refers to the duration within a single B-DC pulse in which the bias signal is neutral. It is understood that the bias signal is off during the B-DC-burst separation time. However, by definition, the neutral bias duration includes only the duration in each individual B-DC pulse when the bias polarity is neither positive nor negative relative to the reference potential.

For illustrative purposes, the schematic view of the plasma processing chamber 110 in FIG. 1 shows a snapshot of plasma 150 at a time when positively charged ions (indicated by "+") have been attracted preferentially towards the bottom RF electrode 118 and the substrate 108, while the negatively charged electrons (indicated by "e") have been repelled in an opposite direction towards the top RF electrode 116, possibly under the influence of the bias signal. The neutral radicals (indicated by "R") may drift with the gas flow or diffuse out towards the RF electrodes but, being charge neutral, the flux of radicals is not modulated by the electromagnetic fields in the plasma processing chamber 110. Reaction byproducts (indicated by "B") are seen near the substrate 108. The positively charged ions and the negatively charged electrons may be pushed in opposite directions by an electric field, for example, towards the bottom or the top, depending on the instantaneous polarity of the time-varying bias signal applied between the top RF electrode 116 and the bottom RF electrode 118. As explained in further detail below, this dependence may be exploited in the embodiments described in this disclosure to influence the plasma process by shaping the B-DC waveforms of the bias signal synchronously with the RF source signal.

The parameterization and synchronization of the RF source and bias signals are explained with reference to FIGS. 2A-2D.

Figure 2A:
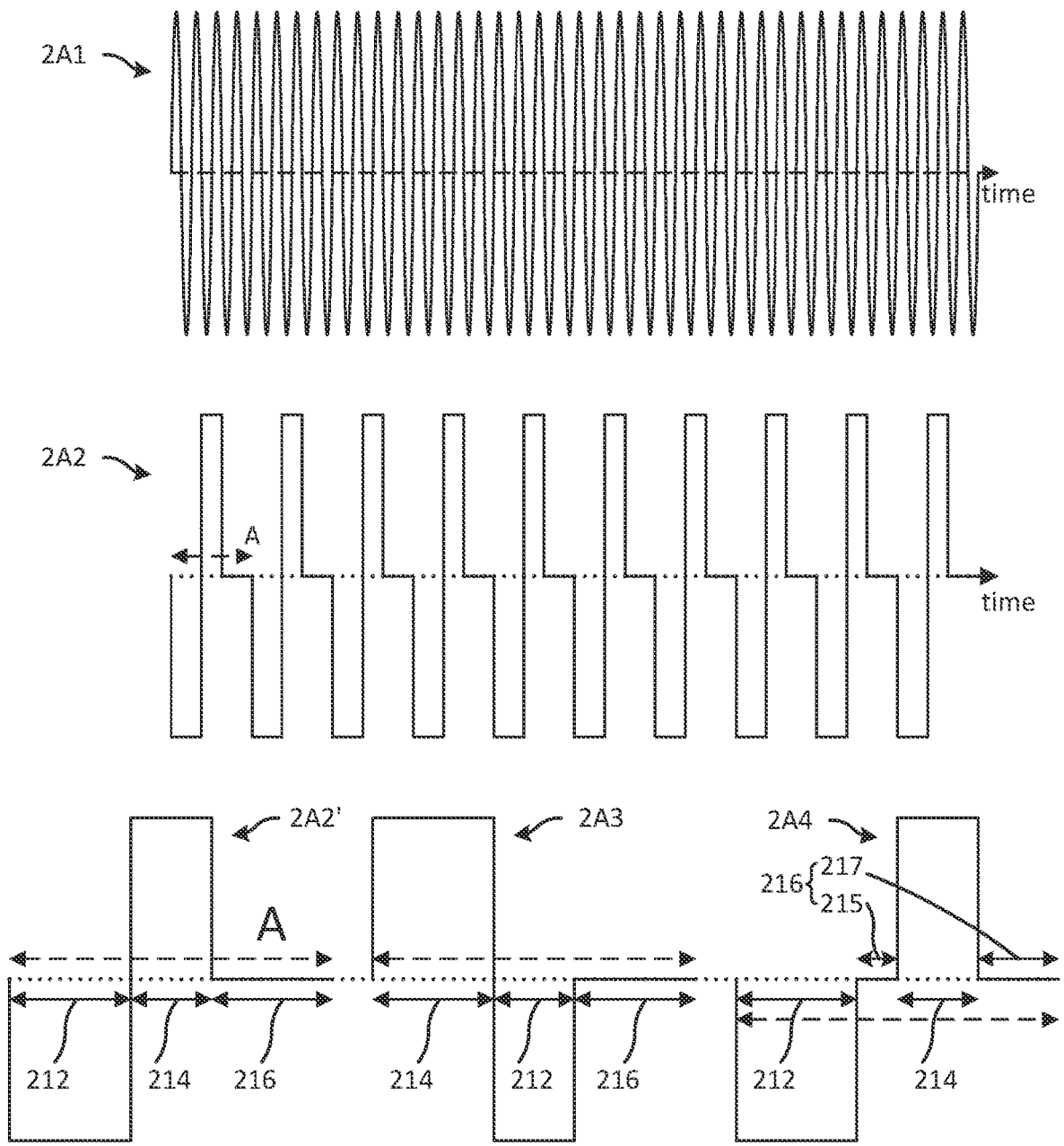
FIGS. 2A-2D illustrate plots of various parameterized waveforms of RF source signals and pulsed bipolar-DC (B-DC) bias signals, in accordance with some embodiments.

FIG. 2A illustrates example plots of the CW-RF waveform 2A1 output from the CW-RF source signal source 120 and the continuous B-DC waveform 2A2 output from the continuous B-DC bias signal source 130 of the plasma processing system 100 in FIG. 1.

In FIG. 2A, the CW-RF waveform 2A1 is a continuous RF sinusoid of a fixed frequency and amplitude. It is understood that some other continuous RF waveform may also be used, for example, an RF sawtooth waveform.

A dashed double arrow "A" indicates one B-DC pulse of the continuous B-DC waveform 2A2 in FIG. 2A. The example B-DC waveform 2A2 is a pulse train where each B-DC pulse has three pulse segments and the timing parameters are the durations of the three pulse segments indicated by solid double arrows in a magnified plot of the single B-DC pulse 2A2'. The parameters are: the negative bias duration 212 during which the pulse has negative polarity, the positive bias duration 214 during which the pulse has positive polarity, and the neutral bias duration 216 during which the pulse has neutral polarity relative to the reference potential (o V). As illustrated in the respective plots in FIG. 2A, in the B-DC pulse 2A2', the negative bias duration occurs before the positive bias duration, whereas, it is the opposite in the B-DC pulse 2A3. The B-DC pulse 2A3 may be obtained by simply flipping the polarity of the negative and positive bias segments of the B-DC pulse 2A2'. So, in the example configuration of the plasma processing system 100 illustrated in FIG. 1, applying B-DC pulses 2A2' to the bottom RF electrode 118 would first attract ions to the substrate 108 (during the negative bias duration 212) then, during the positive bias duration 214, attract free electrons to neutralize any positive charge buildup. In another embodiment, the connections for the RF source signal and the bias signal may be flipped so the top RF electrode 116 is coupled to the RF source signal and the bottom RF electrode 118 is coupled to the bias signal. In this configuration, the B-DC pulse 2A3 would achieve the same effect as B-DC pulse 2A2' in the configuration illustrated in FIG. 1. Accordingly, the continuous B-DC bias signal source 130 may be programmed to generate B-DC pulses 2A3. The bias signal is at roughly 0V (the reference potential) during the neutral bias duration 216, allowing time for enough radicals and ions to diffuse to the surface before bombarding the surface with ions again. In some embodiment, the neutral bias duration 216 may be split into a first neutral bias pulse segment 215 and a second neutral bias pulse segment 217, as illustrated by B-DC pulse 2A4 in FIG. 2A. Although rarely used, the first neutral bias pulse segment 215 may delay the neutralizing flux of free electrons during a transient ion flow following the end of the negative bias duration 212.

Although the example B-DC waveform 2A2 and the B-DC pulses 2A2',2A3, and 2A4 in FIG. 2A depict equal magnitudes of the negative bias and the positive bias, it is understood that unequal magnitudes may also be used.

Figure 2B:
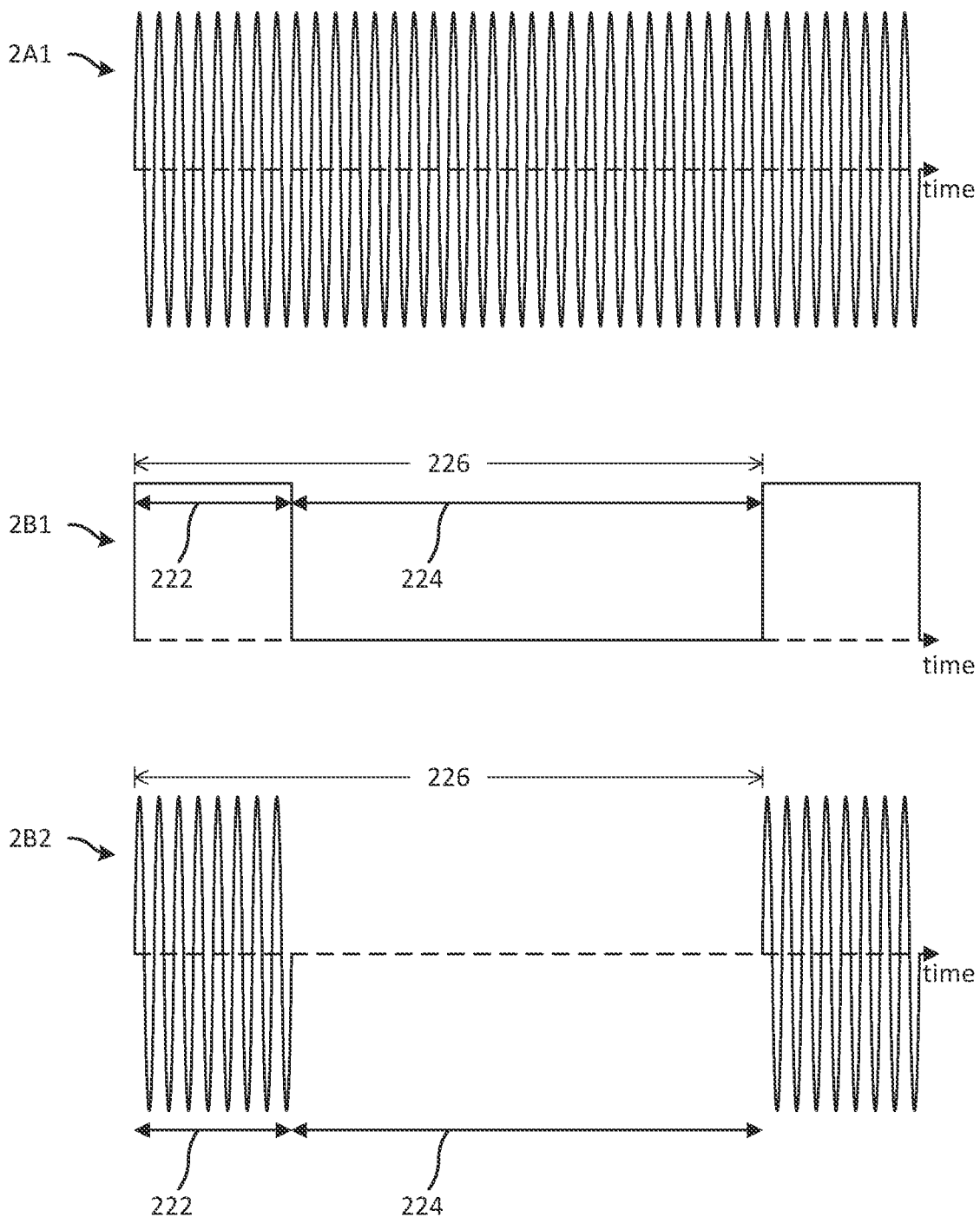

FIG. 2B illustrates plots of the CW-RF waveform 2A1, an example gating waveform 2B1 generated, for example, in the first programmable chopper 124 (see FIG. 1), and an RF-burst waveform 2B2 generated by modulating the CW-RF waveform 2A1 with the gating waveform 2B1. As illustrated in FIG. 2B, one burst period 226 of the gating waveform 2B1 is the sum of one burst duration 222 and one burst separation time 224. The gating signal having the gating waveform 2B1 allows the CW-RF waveform 2A1 to pass through during the burst duration 222 and blocks the CW-RF waveform 2A1 during the burst separation time 224, thereby generating the RF-burst waveform 2B2. Generally, the main source of power sustaining the plasma (e.g., plasma 150) in a plasma processing chamber (e.g., plasma processing chamber 110) is the RF source signal. So, the weakly ionized plasma may be extinguished during the burst separation time 224, and be reignited after the start of the next RF-burst pulse.

Figure 2C:
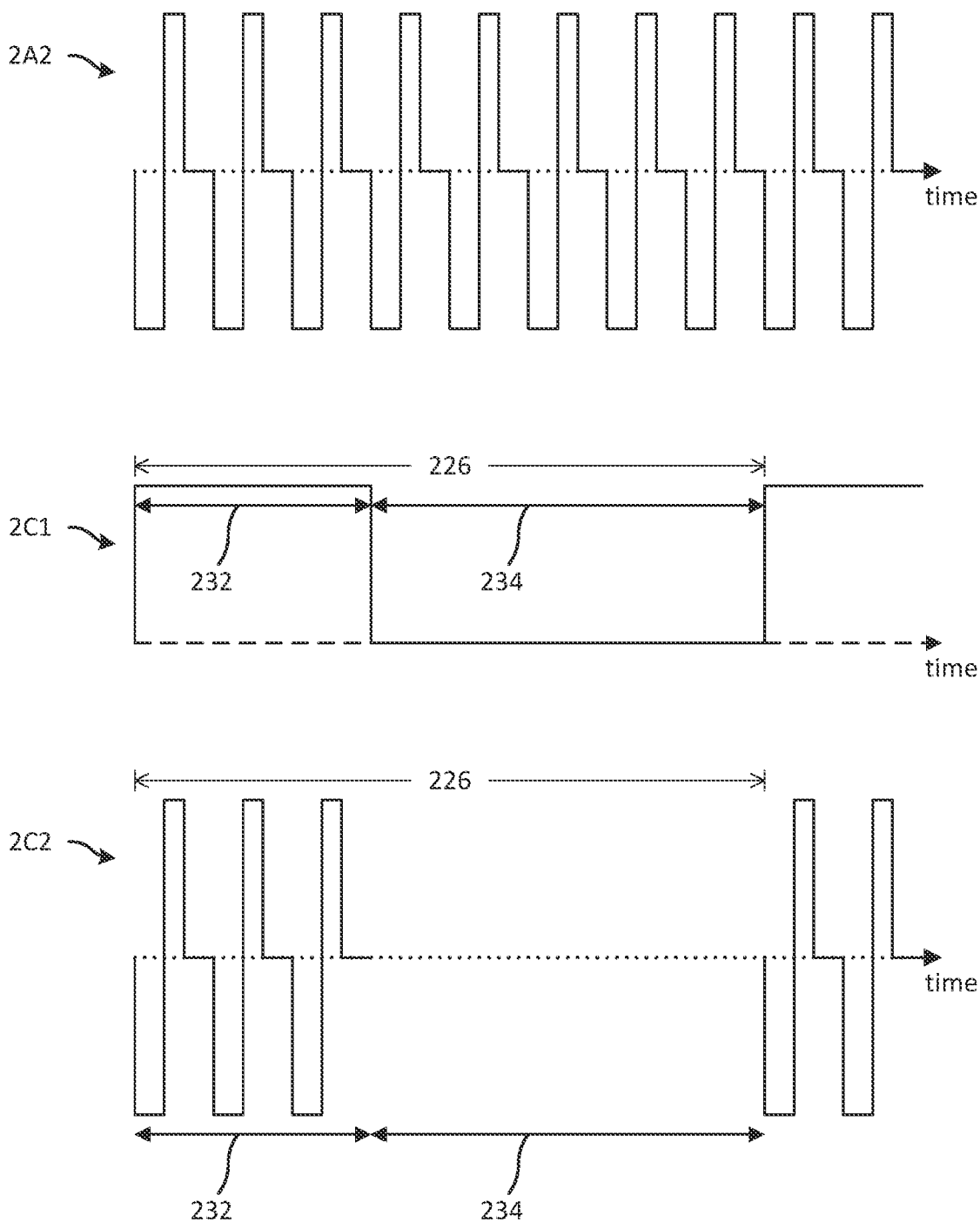

FIG. 2C illustrates plots of the continuous B-DC waveform 2A2, another gating waveform 2C1 generated, for example, in the second chopper 134 (see FIG. 1), and a B-DC-burst waveform 2C2 generated by modulating the B-DC waveform 2A2 with the gating waveform 2C1. The gating waveform 2C1 allows the continuous B-DC waveform 2A2 to pass through unaltered during the burst duration 232 and blocks the continuous B-DC waveform 2A2 during the burst separation time 234, thereby generating the B-DC-burst waveform 2C2, where each B-DC-burst pulse is a burst of three B-DC pulses, as illustrated in FIG. 2C. In various embodiments, a B-DC burst pulse may comprise a single B-DC pulse or a different number of multiple B-DC pulses.

It is noted that the same burst period 226 is used for the gating signal waveform 2C1 in FIG. 2C as used for the gating signal waveform 2B1 in FIG. 2B. As mentioned above, in the embodiments of plasma processing systems (e.g., plasma processing system 100) described in this disclosure, both of the first and second choppers 124 and 134 are controlled by the timing controller 140 to use a single value as the burst period for a B-DC-burst waveform and the burst period for the respective RF-burst waveform. As explained with reference to the plots of the waveforms in FIG. 2D, the two burst periods are set to the same value because the RF source signal and the respective bias signal are synchronized by a constant burst delay 242.

Figure 2D:
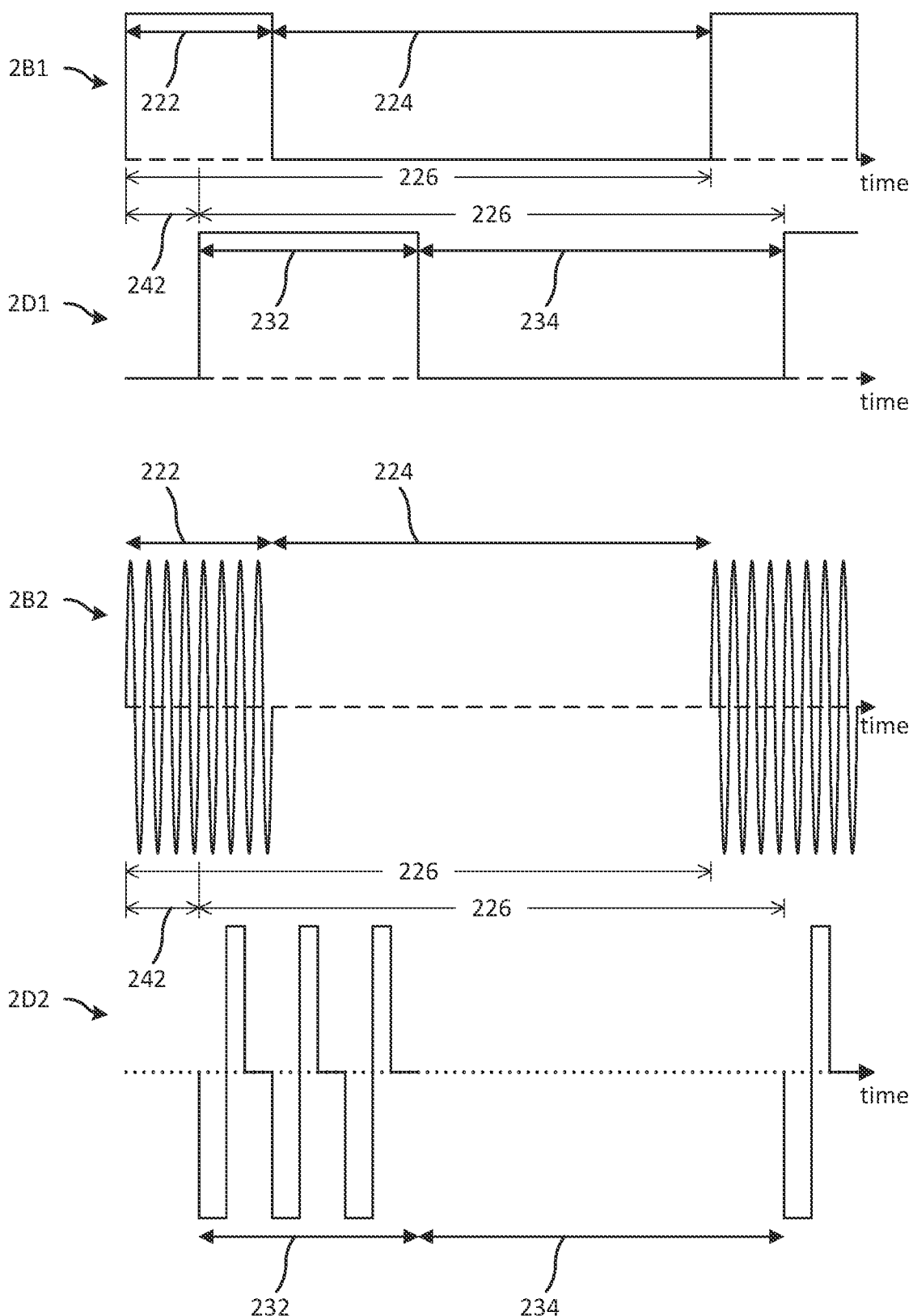

FIG. 2D illustrates plots of a gating waveform 2D1 and the respective B-DC-burst waveform 2D2, along with the gating waveform 2B1 and the respective RF-burst waveform 2B2, also illustrated in FIG. 2B. In this example, the burst duration 232 of the gating waveform 2D1 is different from the burst duration 222 of the gating waveform 2B1. Likewise, the burst separation time 234 of the gating waveform 2D1 is different from the burst separation time 224 of the gating waveform 2B1. However, both of the gating waveforms 2B1 and 2D1 have the same burst period 226. In FIG. 2D, the gating waveform 2D1 has been delayed by a burst delay 242 with respect to the gating signal 2B1. Accordingly, the B-DC-burst waveform 2D2 is also delayed by the burst delay 242 from the RF-burst waveform 2B2. It is noted that each B-DC-burst pulse of the B-DC-burst waveform 2D2 starts at a fixed delay time after the start of each RF-burst pulse of the RF-burst waveform 2B2. The constant separation is equal to the burst delay and synchronizes the RF source signal having the RF-burst waveform 2B2 with the bias signal having the B-DC-burst waveform 2D2. The synchronization with a fixed delay has been possible because the burst period 226 is common to the gating signal waveforms 2B1 and 2D1.

Figure 3A:
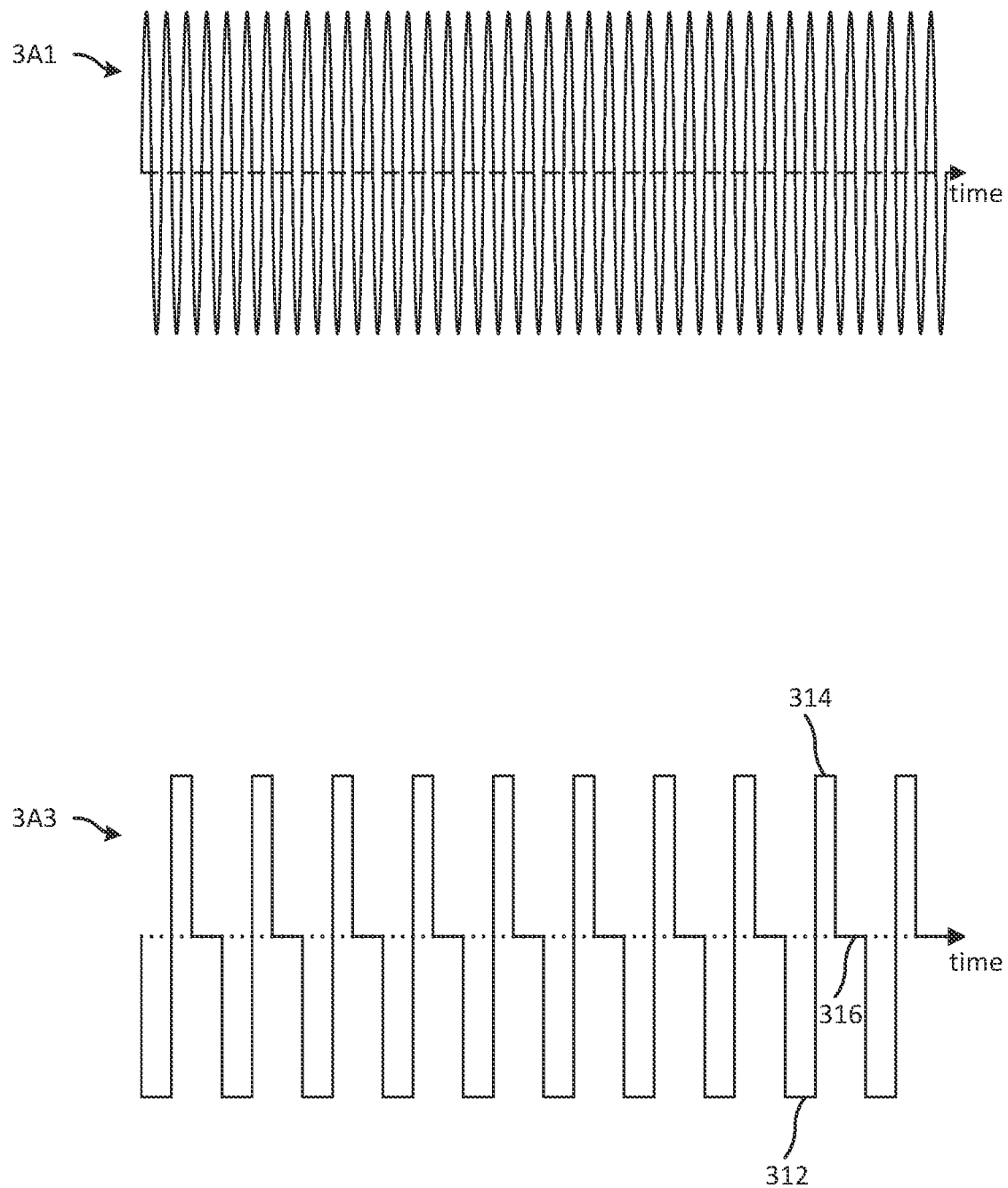
FIGS. 3A-3B illustrate plots of various B-DC waveforms of bias signals used in conjunction with continuous wave (CW) RF waveforms of RF source signals to sustain plasma in a plasma processing chamber, in accordance with some embodiments.
Figure 3B:
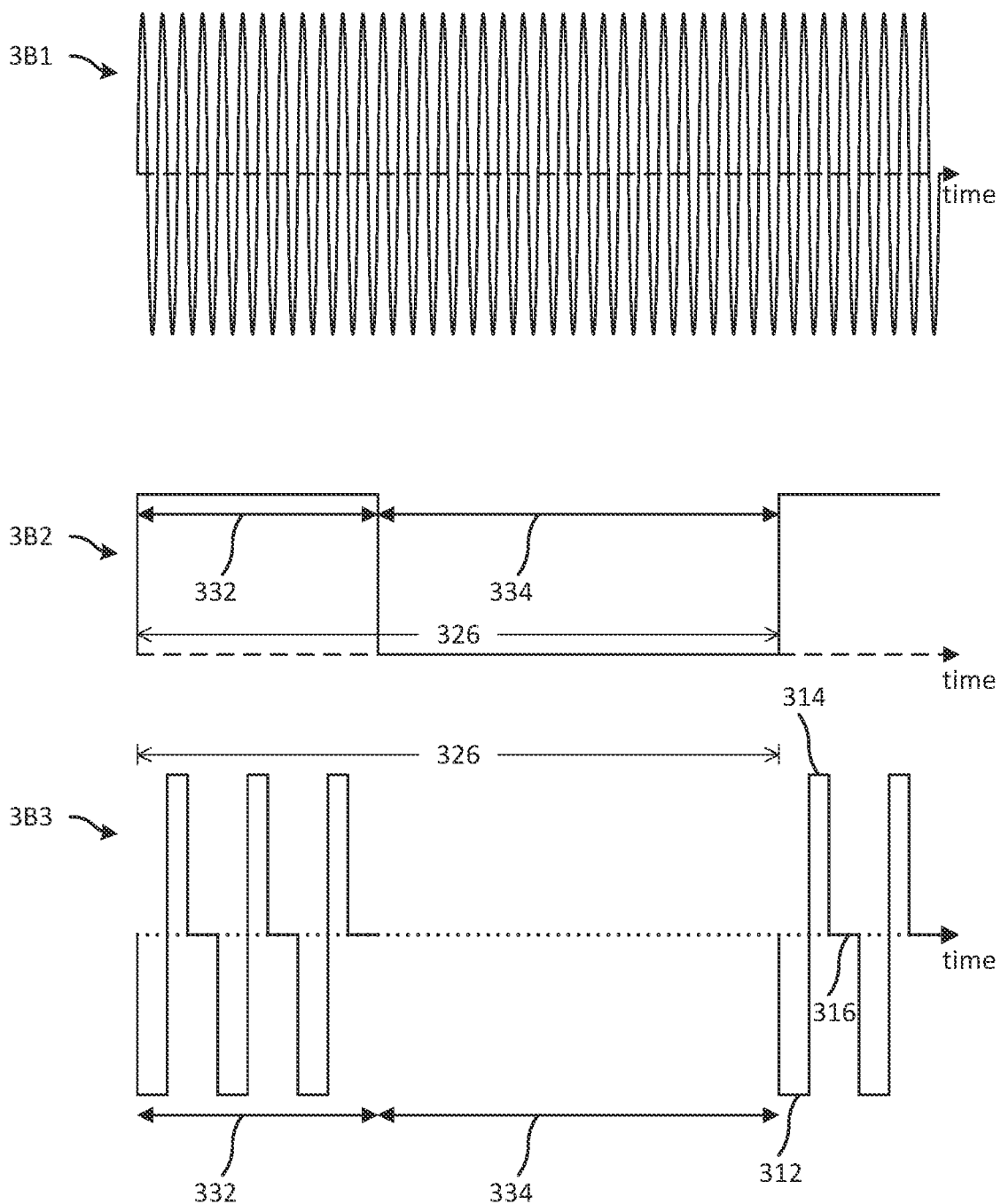

FIGS. 3A and 3B illustrate plots of pairs of RF source and bias signals used in embodiments where the RF source signal has a CW-RF waveform. For each pair, the RF source signal and the bias signal are used in conjunction with each other to sustain plasma for plasma processing.

In FIG. 3A, the CW-RF waveform 3A1 is paired with a bias signal having the continuous B-DC waveform 3A3 comprising a continuous train of B-DC pulses. Each B-DC pulse of the pulse train has three timing parameters: a negative bias duration 312, a positive bias duration 314, and a neutral bias duration 316, similar to the B-DC pulse 2A2' described above with reference to FIG. 2A.

In FIG. 3B, the same CW-RF waveform 3B1 has been paired with a bias signal having the B-DC-burst waveform 3B3 comprising a train of B-DC-burst pulses, where each B-DC-burst pulse is a burst of three B-DC pulses. In this example, each of the three B-DC pulses in one burst uses the same three timing parameters used in for the B-DC pulses of the continuous B-DC waveform 3A3 (see FIG. 3A). In addition, since the B-DC-burst waveform 3B3 is a train of periodic bursts of three B-DC pulses, it has two more timing parameters, a burst duration 332 and a burst separation time 334, originating from a gating signal waveform 3B2 that has been used to generate the B-DC-burst waveform 3B3. The sum of the burst duration 332 and the burst separation time 334 is the burst period 326, as indicated in FIG. 3B.

The three parameters for the B-DC pulses of 3A3 and 3B3, and the two additional parameters for the B-DC-burst pulses may be selected, for example, by processor 142 and controlled by the timing controller 140 in plasma processing system 100 (illustrated in FIG. 1). Since the RF-source signal waveform is present continuously, there is no burst delay and no synchronization to be performed.

The plasma (e.g., plasma 150), which is analogous to an engine generating ions, free electrons, and radicals, is fueled to a large extent by RF power from the RF-source signal. Thus, if the RF source signal has a CW-RF waveform then ions and radicals are being generated continuously in the central quasi-neutral region. These ions and radicals slowly diffuse outward toward the plasma sheath at the edge of the quasi-neutral region. The electric field of the plasma sheath accelerates (or retards) the charged particles (positive ions and negative free electrons) while the neutral radicals continue to diffuse through the sheath toward the substrate (and the chamber walls). The time-varying bias signal may have a strong influence on the electric field in the plasma sheath. In the embodiments described in this disclosure, the bias signals have B-DC waveforms. The different segments of the B-DC pulse influence the interaction of ions, radicals and free electrons, with the substrate in different ways, as explained further below. The removal and/or re-deposition of byproducts of these interactions are also influenced by the parameters of the B-DC waveforms 3A3 and 3B3 such as the burst separation time 334 in FIG. 3B.

When the substrate (e.g., substrate 108) is biased negative, the electric field in the plasma sheath is increased in a direction that accelerates ions from the quasi-neutral region towards the substrate. The ions acquire very high directed kinetic energy resulting in a burst of ions bombarding the surface. A rectangular pulse with very short rise time and fall time may be preferred in order to achieve a narrow spread in the energy distribution of the energetic ions. The duration of this negative polarity bias may not be too short because of the slow response time of the relatively low mobility of ions.

On the other hand, there are several reasons why it is undesirable to use a long duration of negative polarity bias. If the negative bias is present for a long time then there is a large fluence of ions that bombard the surface, physically dislodging an amount of material that far exceeds the amount which can chemically react with a low fluence of radicals provided by the slow diffusion of radicals from the plasma to the substrate. With insufficient radicals available to chemically react with the dislodged material, the etch rate is slow, some of the dislodged material may re-deposit randomly instead of being converted to a volatile byproduct, and the etch mechanism being more physical than chemical is also less selective to other exposed materials. Furthermore, the supply of ions may deplete, hence the bombardment with ions may become inefficient with time.

Another reason why the duration of the negative polarity bias cannot be too long is that, in some processes, the positive ions may cause charge buildup in the substrate. To neutralize the positive charge buildup, the pulse segment that applies negative bias to the substrate may be followed by a segment that applies positive bias to the substrate. The positively biased substrate attracts negatively charged free electrons to neutralize the positive charge buildup. Electrons being light and highly mobile, the time for which the substrate has positive polarity may be kept short.

The neutral bias duration (the duration within a single B-DC pulse when the bias signal has neutral polarity) may be used to adjust the fluence of radicals relative to the fluence of ions in each B-DC pulse. If the neutral bias duration is too short, that is, the ion bursts are too frequent then the ratio of radical to ion fluence may be unacceptably low, particularly in deep trenches, where the surface is further removed from plasma, so the radicals have to diffuse over a longer distance. Since the RF source signal (e.g., the RF source signal having the CW-waveform 3B1 in FIG. 3B) is continuously present, hence radicals are continuously being generated, the burst separation time (e.g., burst separation time 334 in FIG. 3B) also help radicals to diffuse over long distances.

Another advantage provided by the burst separation time 334 is that it allows volatile byproducts of the chemical and physical interactions to be removed by the vacuum pump through the exhausts (e.g., exhausts 114 in FIG. 1). In some embodiments, a volatile byproduct may be unstable and decompose in a secondary chemical reaction to form a solid byproduct that deposits on exposed surfaces and may distort the profile of, for example, sidewall of an etched feature. It is noted that, in some embodiments, solid byproducts may be used to passivate a surface, for example, a trench sidewall.

Figure 4A:
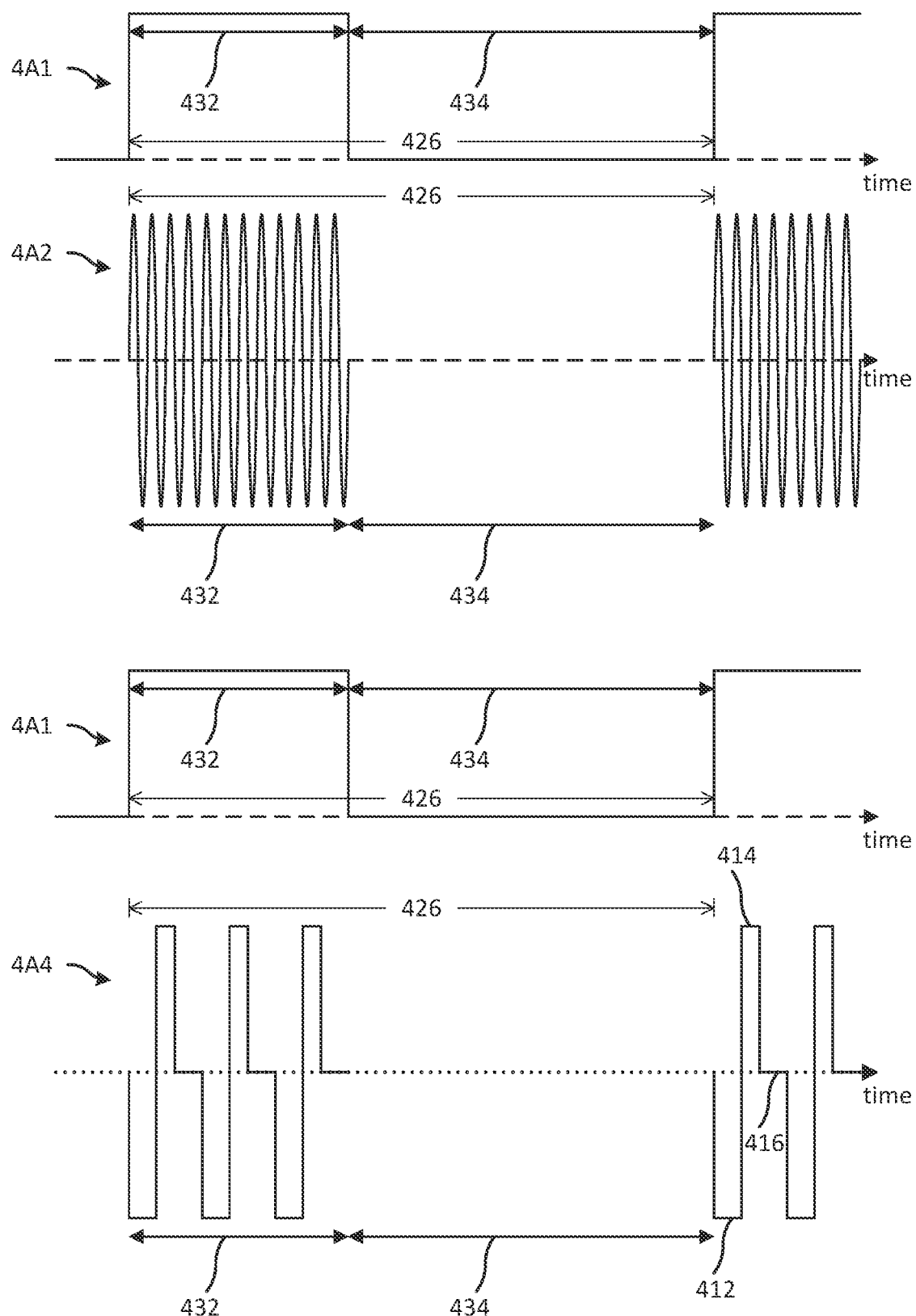
FIGS. 4A-4C illustrate plots of various B-DC waveforms of bias signals used in conjunction with RF-burst waveforms of RF source signals to sustain plasma in a plasma processing chamber, in accordance with some embodiments.
Figure 4B:
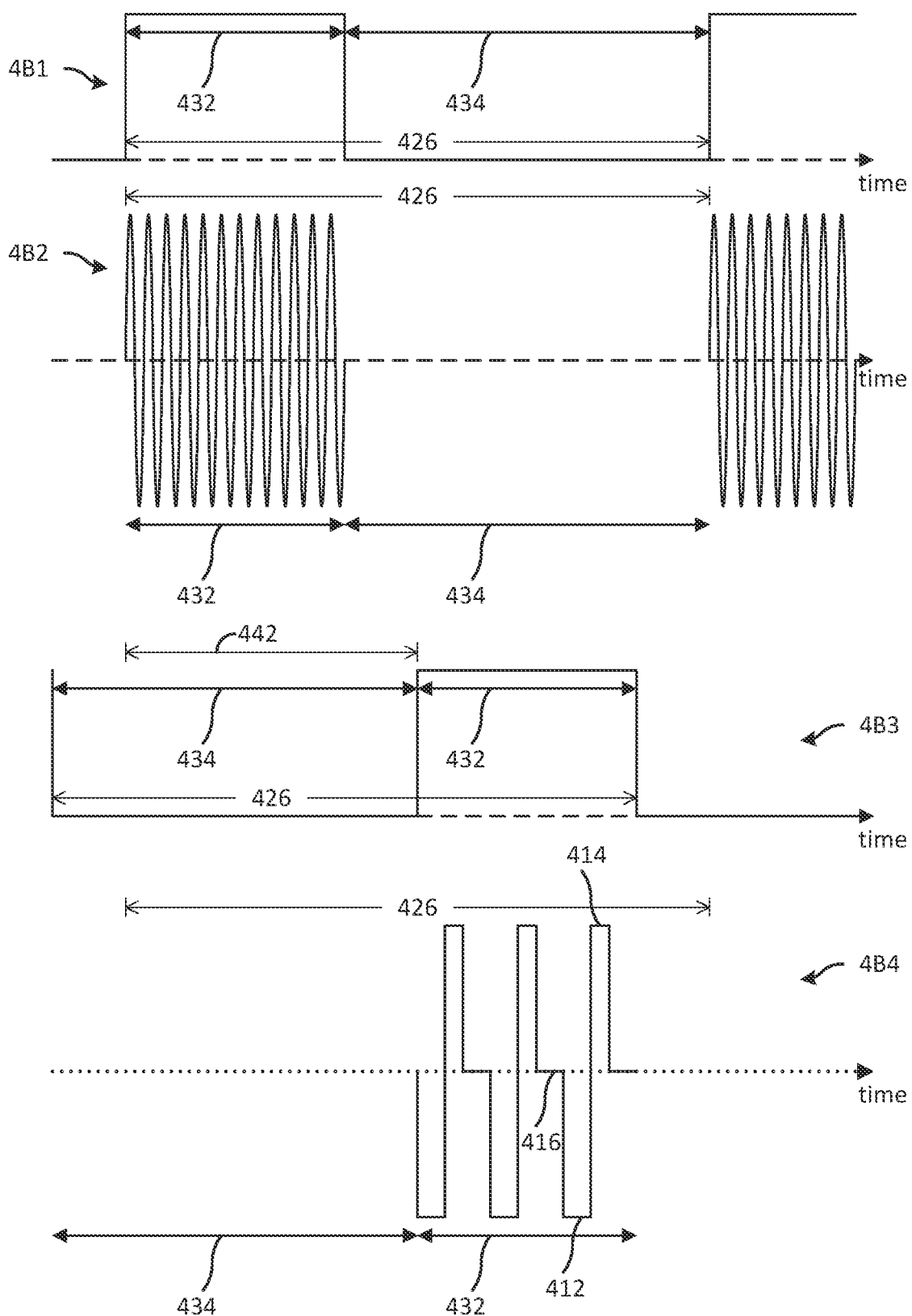
Figure 4C:
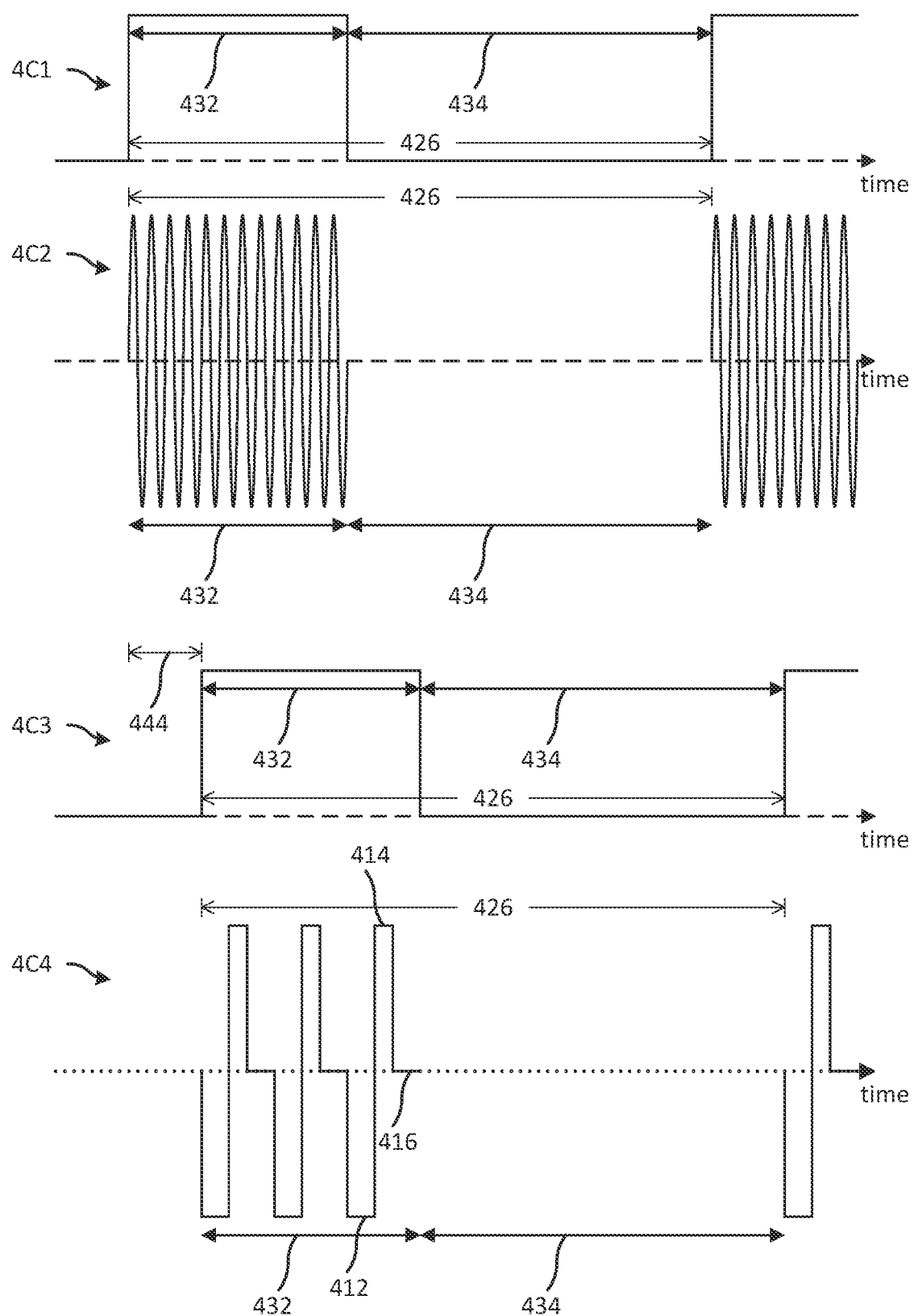

FIGS. 4A-4C illustrate plots of example pairs of RF source and bias signals where both signals have burst-pulse waveforms. Since the RF source signal has an RF-burst waveform, the plasma may be extinguished when the RF-signal is blocked during the RF-burst separation time, thereby "cooling" the free electrons and pausing the generation of ions and radicals. The plasma may be re-ignited and the generation processes renewed when the RF-source signal is applied again at the start of the next burst duration. The RF-burst waveform and the B-DC-burst waveform of each pair are synchronized by a burst delay, similar to the synchronized pair of waveforms (RF-burst waveform 2B2 and B-DC-burst waveform 2D2) in FIG. 2D. Each B-DC pulse of the B-DC-burst waveforms 4A4, 4B4, and 4C4 (in FIGS. 4A, 4B, and 4C, respectively) has the same negative pulse duration 412, positive pulse duration 414, and neutral pulse duration 416 for illustrative purposes only.

In FIG. 4A, an RF source signal having an RF-burst waveform 4A2 is used in conjunction with a bias signal having a B-DC-burst waveform 4A4. In this example, a gating waveform 4A1 is used to generate the RF-burst waveform 4A2, and the same waveform is used to generate the B-DC-burst waveform 4A4. A burst duration 432 and a burst separation time 434, adding up to a burst period 426 has been used. In this example embodiment, the burst delay is zero. Using the same gating waveform (e.g., gating waveform 4A1) and zero burst delay results in generating a pair of in-phase burst waveforms: RF-burst waveform 4A2 and B-DC-burst waveform 4A4. The example in FIG. 4A is a special case of an in-phase burst waveform. In general, in an in-phase burst waveform, the B-DC-burst waveform is not present in the absence of an RF source signal. Accordingly, the RF burst duration is greater than or equal to the B-DC burst duration and the burst delay may be between zero and the difference between the RF burst duration and the B-DC-burst duration. Having a pulse segment where there is no RF source signal and no bias signal creates a duration for which there may be no byproducts produced. Since the gas flow system operates continuously, the byproducts may be efficiently removed from the plasma processing chamber (e.g., from plasma processing chamber 110 in FIG. 1) by the vacuum pumps of the gas flow system.

FIG. 4B illustrates an RF-burst waveform 4B2, generated using gating waveform 4B1. The RF-burst waveform 4B2 and the gating waveform 4B1 are same as the respective RF-burst waveform 4A2 and gating waveform 4A1, illustrated in FIG. 4A, for illustrative purposes only. FIG. 4B also illustrates a B-DC-burst waveform 4B4 (and respective gating waveform 4B3) used in conjunction with the RF-burst waveform 4B2. The burst duration 432 and burst separation time 434 (hence the burst period 426) of the RF-burst pulse waveform 4B2 are chosen to be same as those for the B-DC-burst waveform 4B4, also for illustrative purposes only. Unlike the example waveforms in FIG. 4A, the burst delay 442 is not zero in FIG. 4B. It is noted that, there is no overlap of the B-DC-burst pulses with the RF-burst pulses, as illustrated in FIG. 4B. Because there is no overlap of the B-DC-burst pulses with the RF-burst pulses, this example pair of waveform is referred to as out-of-phase burst waveforms. In general, in an out-of-phase burst waveform, the B-DC-burst waveform and the RF source signal are never present simultaneously. Accordingly, the B-DC burst duration is less than or equal to the RF burst separation time and the burst delay is greater than or equal to the RF burst duration and less than or equal to the B-DC-separation time.

Consider, for example, the RF source signal having the RF-burst waveform 4B2 and the bias signal having the B-DC-burst waveform 4B4 coupled to the top RF electrode 114 and the bottom RF electrode 118, respectively, in the configuration of the plasma processing system 100, as illustrated in FIG. 1. The burst delay 442 being greater than the RF-burst duration 432, the following sequence of events may occur periodically. Plasma 150 is ignited at the start of each RF-burst pulse and sustained through the burst duration 432, generating ions, free electrons, and radicals. But, in the absence of any bias signal, there are no frequent bursts of very high energy ions bombarding the surface of the substrate, although some ions accelerate through the plasma sheath and strike the surface. However, in the absence of any bias signal, the energy gained by accelerating through the sheath is relatively low. As explained above, the diffusion of radicals and other particle species in the plasma processing chamber 110 occurs continuously, largely independent of the presence or absence of any bias signal. At the end of the RF-burst pulse, the electron temperature, $T_e$, drops and plasma 150 extinguishes.

Since the burst delay 442 is greater than the RF-burst duration 432, there is a short wait during which there is no RF signal or bias signal. After this short wait, the B-DC-burst pulse starts. Typically, the relaxation times for ions and radicals to reach thermal equilibrium concentrations are relatively long compared to the short wait. So, ions and radicals are present in non-equilibrium concentrations in the plasma processing chamber 110 during the B-DC-burst duration. A burst of several B-DC pulses at this time may accelerate the ions, the energized ions bombard the substrate, and radicals chemically react with the substrate material and other radicals, forming volatile byproducts. One benefit of accelerating ions when $T_e$ has dropped is that it helps in reducing the random component of the kinetic energy of ions. A reduction in the random component of the kinetic energy of ions (or, equivalently, a drop in ion temperature) reduces the component of ion velocity parallel to the surface of the substrate, thereby bringing the impingement angle closer to the normal to the surface. This results in a narrow spread in the angle distribution of the energetic ions. In other words, more of the high energy ions are directed perpendicular to the surface. A near vertical ion flux help achieve high anisotropy for an RIE process that may be used to form high aspect ratio contact holes, often referred to as HARC etch. The narrow spread in angle is beneficial in avoiding undesirable collisions with sidewalls of deep trenches during a HARC etch process.

FIG. 4C illustrates plots of another pair of an RF source signal having an RF-burst waveform 4C2 generated using a gating waveform 4C1 in conjunction with a bias signal having a B-DC-burst waveform 4C4 generated using a gating waveform 4C3. For illustrative purposes, except for a burst delay 444, all the timing parameters for the waveforms 4C1, 4C2, 4C3, and 4C4 are set equal to the respective parameters in the respective waveforms in FIGS. 4A and 4B. In FIG. 4C, the burst delay 444 is greater than zero, and less than or equal to the RF-burst duration 432. Thus, a portion of each B-DC-burst pulse overlaps the RF-burst pulse and the remaining duration of B-DC-burst pulse extends beyond the end of the RF-burst pulse. In general, in an overlap burst-waveform, one portion of the B-DC-burst waveform is present during the presence of the RF source signal and the remaining duration of the B-DC waveform is in the absence of the RF source signal. As mentioned above, although the burst delay is greater than zero, it is less than or equal to the RF-burst duration to ensure that there is some overlap. In order to ensure that the B-DC-burst pulse extends into the RF-burst separation time, the burst delay (e.g., burst delay 444) is selected such that a sum of the burst delay and the B-DC-burst duration is greater than the RF-burst duration. In order to prevent the B-DC burst waveform to extend beyond the RF burst separation and overlap with the next RF-burst pulse, the burst delay should not exceed the B-DC-burst separation time.

Now, consider the sequence of events that take place when the RF source signal (RF-burst waveform 4C2) and the bias signal (B-DC-burst waveform 4C4) are applied to the top RF electrode 116 and the bottom RF electrode 118, respectively, of the plasma processing chamber 110. Plasma 150 is ignited as the RF-burst pulse starts. Ions, free electrons, and radicals get generated in the absence of any bias signal. During this time, the radicals are diffusing to the substrate but the number of highly energetic ions bombarding the substrate 108 is low because there is no bias signal to accelerate ions to a very high directed kinetic energy.

As illustrated in FIG. 4C, at the end of the burst delay 444, the B-DC-burst pulse of the bias signal starts. The negative polarity segments of the B-DC pulses accelerate the ions. Energetic ions along with the radicals interact physically and chemically with the substrate producing volatile byproducts. The RF sinusoid and the B-DC pulses are both present till the RF source signal gets blocked at the end of the RF-burst duration 432. The presence of the RF source signal maintains the electron temperature, $T_e$, and the ion temperature, $T_{ion}$, elevated. As soon as the RF source signal turns off, both $T_e$ and $T_{ion}$ starts to drop. As explained above, the random component of ion kinetic energy is undesirable for anisotropic plasma etching, for example, a HARC etch processes. Thus, the duration where the RF source signal is blocked but the bias signal is present provides the advantage of accelerating ions to acquire a very high directed kinetic energy without excessively increasing the random component.

Continuation of the B-DC-burst duration beyond the end of the RF-burst pulse, as is illustrated in FIG. 4C, allows the etch process to continue during a time when the electron temperature, $T_e$, has dropped. As explained above, this is advantageous for highly anisotropic etching of high aspect ratio trenches (e.g., a HARC etch process).

The RF source signal and the bias signal are both blocked in the duration between the end of the B-DC-burst duration and the start of the next RF-burst duration. As described above with reference to FIGS. 3B and 4A, a time duration when both the RF source and the bias signals are absent may be adjusted to remove volatile byproducts through the exhausts 114 of the plasma processing chamber 110 (see FIG. 1).

Figure 5A:
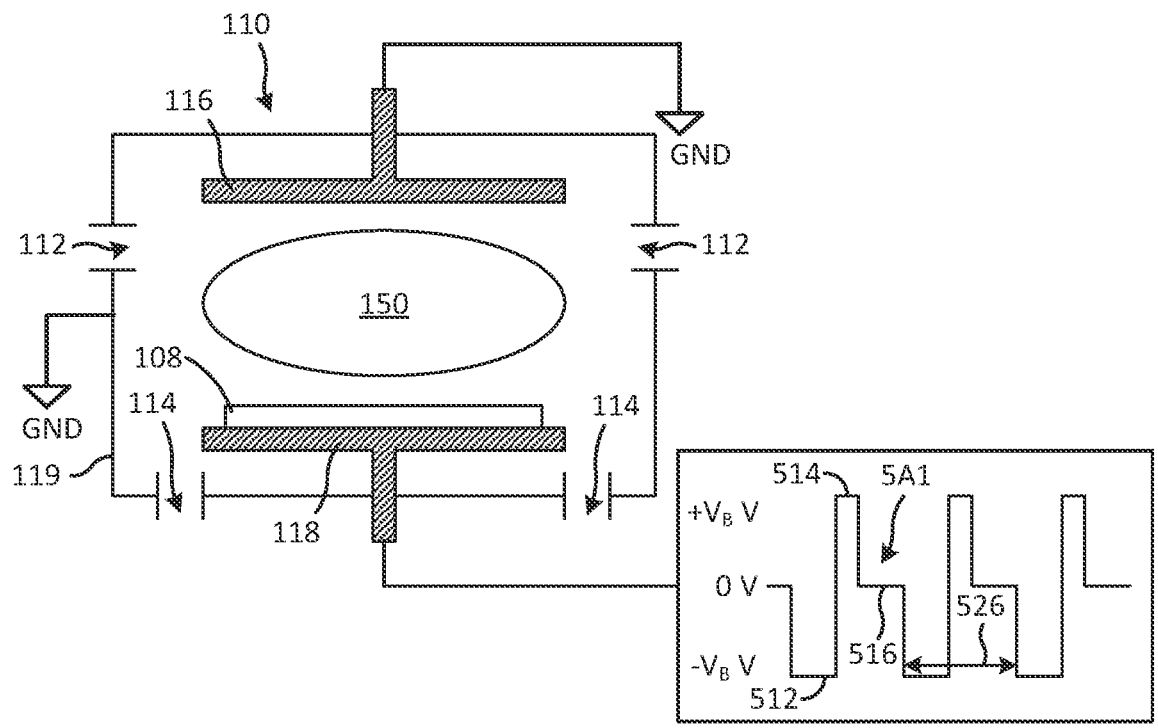
FIGS. 5A and 5B illustrate schematics of two alternative configurations of a plasma processing system for coupling a B-DC bias signal between two electrodes of a plasma processing chamber, in accordance with some embodiments.
Figure 5B:
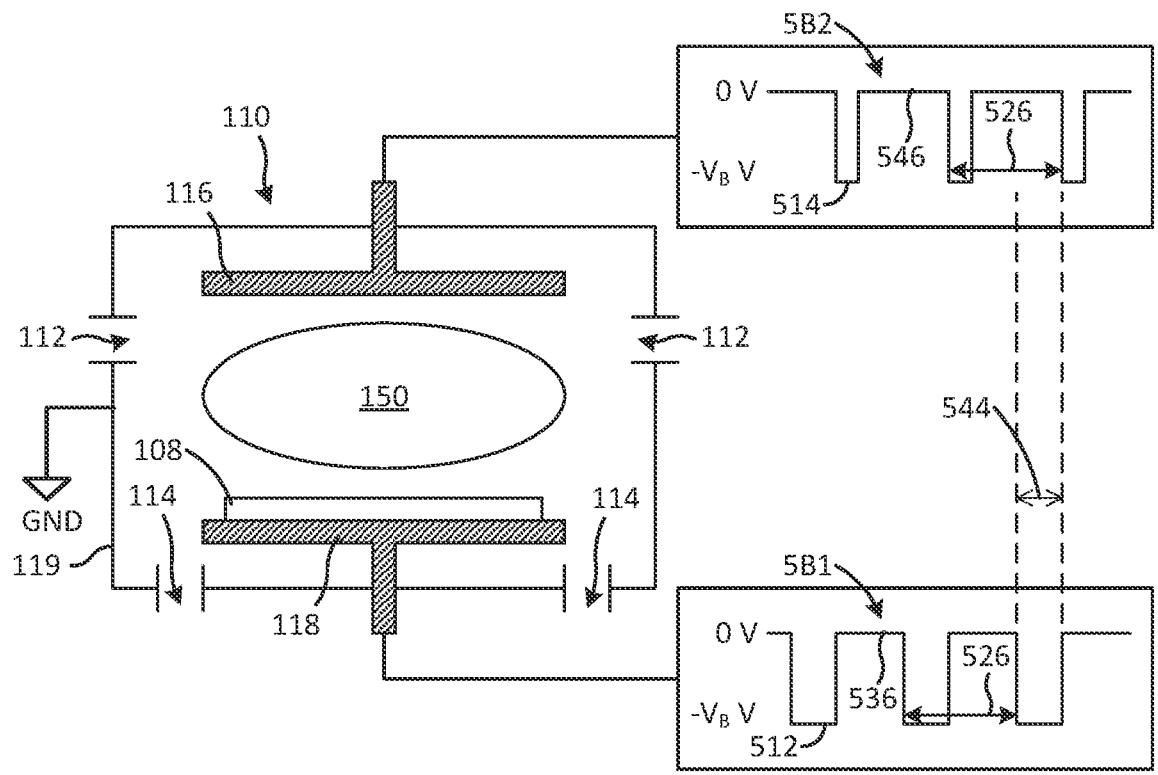

FIGS. 5A and 5B illustrate two configurations for applying the same bias signal between a first electrode and a second electrode, the bias signal having a B-DC waveform 5A1. A difference of a first unipolar DC (U-DC) signal having a first U-DC waveform 5B1 and a second U-DC signal having a second U-DC waveform 5B2 may provide a bias signal having a B-DC waveform 5A1. In FIGS. 5A and 5B, the first electrode is the bottom RF electrode 118 and the second electrode is the top electrode RF 116 of the plasma processing chamber 110. The plasma processing chamber 110 illustrated in FIGS. 5A and 5B is similar to the processing chamber 110 illustrated in FIG. 1. The bottom RF electrode 118 is included in a substrate holder holding the substrate 108. A conductive portion 119 of the wall of the plasma chamber 110 is coupled to the reference potential.

In the configuration illustrated schematically in FIG. 5A, the bottom RF electrode 118 (the first electrode) is coupled to a bias signal having a B-DC waveform 5A1 comprising a train of B-DC pulses. The top RF electrode 116 (the second electrode) is coupled to the reference potential, which is equal to 0 V and indicated as GND. For illustrative purposes the positive bias is $+V_B$ V and the negative bias is $-V_B$ V, where 0 V is the neutral bias. It is understood that unequal magnitudes may also be used. Each B-DC pulse of the B-DC waveform 5A1 is similar to the B-DC pulse 2A2' described above with reference to FIG. 2A. It is understood that other B-DC pulses such as those similar to 2A3 or 2A4, described with reference to FIG. 2A, may also be used.

As illustrated in FIG. 5A, a B-DC pulse of the B-DC waveform 5A1 has a negative bias duration 512 during which the pulse has negative polarity, a positive bias duration 514 during which the pulse has positive polarity, and a neutral bias duration 516 during which the pulse has neutral polarity relative to the reference potential. A sum of the three bias durations 512, 514, and 516 is a pulse period 526 of the B-DC pulse of the B-DC waveform 5A1. Similar to neutral bias duration 216 of the B-DC pulse 2A2' in FIG. 2A, the neutral bias duration 516 is a continuous pulse segment, there being no separation between the end of the negative bias duration 512 and start of the positive bias duration 514.

In the configuration illustrated schematically in FIG. 5B, the bottom RF electrode 118 is coupled to the first U-DC signal having the first U-DC waveform 5B1 comprising a train of unipolar pulses of negative polarity. The top RF electrode 116 is coupled to the second U-DC signal having the second U-DC waveform 5B2 comprising another train of unipolar pulses also of negative polarity.

The pulse width of each U-DC pulse of the first U-DC waveform 5B1 is selected to be equal to the negative bias duration 512 and the pulse separation time 536 is selected such that a sum of the pulse width (the negative bias duration 512) and the pulse separation time 536 is equal to the pulse period 526 of the B-DC pulse of the B-DC waveform 5A1.

The pulse width of each U-DC pulse of the second U-DC waveform 5B2 is selected to be equal to the positive bias duration 514 and the pulse separation time 546 is selected such that a sum of the pulse width (the positive bias duration 514) and the pulse separation time 546 is also equal to the pulse period 526 of the B-DC pulse of the B-DC waveform 5A1. It is noted that the B-DC waveform 5A1 and the first and the second U-DC waveforms 5B2 and 5B3 all have equal pulse periods.

The first U-DC signal having the first U-DC waveform 5B1 is synchronized with the second U-DC signal having the second U-DC waveform 5B2. The synchronization is achieved by delaying the U-DC pulses of the first U-DC waveform 5B1 by a constant U-DC delay time 544 from the U-DC pulses of the second U-DC waveform 5B2, as illustrated in FIG. 5B. In this example, the constant U-DC delay time 544 has been selected to be equal to the negative bias duration 512 of the of the B-DC pulse of the B-DC waveform 5A1. This selection matches the timing (or phase) of the difference signal to that of the B-DC waveform 5A1. Here, the difference signal is having a difference waveform, where the difference waveform is defined by a difference between the first and the second U-DC waveforms 5B1 and 5B2. The difference waveform exactly matches the B-DC waveform 5A1. The exact match results from the particular choice of the constant U-DC delay time 544 (the choice being the U-DC delay time 544 in FIG. 5B equal to negative bias duration 512 in FIG. 5A) and because there is no separation between the end of the negative bias duration 512 and start of the positive bias duration 514 in the B-DC waveform 5A1 (the neutral bias duration is a continuous pulse segment).

Although the example U-DC waveforms 5B1 and 5B2 are of negative polarity, it is understood that the B-DC waveform 5A1 may also be achieved using a difference between two U-DC waveforms having U-DC pulses of positive polarity.

Using the embodiments described in this disclosure, the timing of the pulsed signals may be adjusted and synchronized to tune, for example, plasma properties, the chemical environment, and charging and neutralization of a surface of the substrate with positively charged ions and negatively charged electrons, respectively. The plasma processing methods may be performed using commands from a processor of the plasma processing system including commands sent to a timing controller configured to synchronously adjust the various pulse waveforms of the RF source signal and pulsed B-DC bias signal coupled to electrodes of the plasma processing chamber.

Example 1. A method for plasma processing includes: sustaining a plasma in a plasma processing chamber, the plasma processing chamber including a first radio frequency (RF) electrode and a second RF electrode, where sustaining the plasma includes: coupling an RF source signal to the first RF electrode; and coupling a bias signal between the first RF electrode and the second RF electrode, the bias signal having a bipolar DC (B-DC) waveform including a plurality of B-DC pulses, each of the B-DC pulses including: a negative bias duration during which the pulse has negative polarity relative to a reference potential, a positive bias duration during which the pulse has positive polarity relative to the reference potential, and a neutral bias duration during which the pulse has neutral polarity relative to the reference potential.

Example 2. The method of example 1, further including coupling a conductive portion of walls of the plasma processing chamber to the reference potential.

Example 3. The method of one of examples 1 or 2, further including: coupling the second RF electrode to the reference potential; and coupling the bias signal to the first RF electrode.

Example 4. The method of one of examples 1 to 3, further including: coupling the bias signal to the second RF electrode.

Example 5. The method of one of examples 1 to 4, where the RF source signal has a continuous wave (CW) RF waveform and the bias signal has a continuous B-DC waveform, the continuous B-DC waveform including a continuous train of B-DC pulses.

Example 6. The method of one of examples 1 to 5, where each of the B-DC pulses has a single pulse segment with the neutral polarity relative to the reference potential defined to be the neutral bias duration, the neutral bias duration being continuous in time.

Example 7. The method of one of examples 1 to 6, where the neutral bias duration is split into a first neutral bias pulse segment and a second neutral bias pulse segment, the first neutral bias pulse segment separating the end of the negative bias duration from the start of a next positive bias duration, the second neutral bias pulse segment separating the end of the positive bias duration from the start of a next negative bias duration.

Example 8. The method of one of examples 1 to 7, where the bias signal has a B-DC-burst waveform including a train of B-DC-burst pulses, where each of the B-DC-burst pulses has a plurality of consecutive B-DC pulses that is present during a B-DC-burst duration followed by a B-DC-burst separation time during which there is no bias signal, a sum of the B-DC-burst duration and the B-DC-burst separation time being defined as a burst period.

Example 9. The method of one of examples 1 to 8, where the RF source signal has a continuous wave (CW) RF waveform.

Example 10. The method of one of examples 1 to 9, where the RF source signal has an RF-burst waveform including a train of RF-burst pulses, where each of the RF-burst pulses has an RF waveform that is present during an RF-burst duration followed by an RF-burst separation time during which there is no RF source signal; where a sum of the FR-burst duration and the RF-burst separation time is equal to the burst period; and where the method further includes: synchronizing the B-DC-burst waveform with the RF-burst waveform, where the synchronizing is delaying the B-DC-burst pulses by a constant burst delay from the RF-burst pulses.

Example 11. The method of one of examples 1 to 10, where the RF-burst duration is greater than or equal to the B-DC-burst duration, and where the burst delay is greater than or equal to zero and less than or equal to a difference between the RF burst duration and the B-DC-burst duration.

Example 12. The method of one of examples 1 to 11, where the B-DC burst duration is less than or equal to the RF burst separation time; where the burst delay is greater than or equal to the RF-burst duration and less than or equal to the B-DC-burst separation time.

Example 13. The method of one of examples 1 to 12, where the burst delay is greater than zero and less than or equal to the smaller of the RF-burst duration and the B-DC-burst separation time, and where a sum of the burst delay and the B-DC-burst duration is greater than the RF-burst duration.

Example 14. A system for plasma processing including: a plasma processing chamber including: a first radio frequency (RF) electrode; a second RF electrode; and a substrate holder configured to hold a semiconductor substrate in the plasma processing chamber; a processor; a non-transitory memory storing a program to be executed in the processor, the program including: instructions to couple an RF source signal to the first RF electrode; and instructions to couple a bias signal between the first RF electrode and the second RF electrode, the bias signal having a bipolar DC (B-DC) waveform including a plurality of B-DC pulses, each of the B-DC pulses including: a negative bias duration during which the pulse has negative polarity relative to a reference potential, a positive bias duration during which the pulse has positive polarity relative to the reference potential, and a neutral bias duration during which the pulse has neutral polarity relative to the reference potential.

Example 15. The system of example 14, further including: a continuous wave (CW) RF source signal source; a programmable continuous B-DC bias signal source; a programmable first chopper coupled to the CW-RF source signal source; a programmable second chopper coupled to the continuous B-DC bias signal source; and a timing controller coupled to the continuous B-DC bias signal source, the first chopper, and the second chopper, where the timing controller is configured to receive commands from the processor which, when executed, synchronously controls an output signal of the first chopper, an output signal of the second chopper and, and an output signal of the continuous B-DC bias signal source.

Example 16. The system of one of examples 14 or 15, where a configuration of the system includes: the first RF electrode coupled to the output signal from the first chopper and the output signal from the second chopper; and the second RF electrode coupled to the reference potential.

Example 17. The system of one of examples 14 to 16, where a configuration of the system includes: the first RF electrode coupled to the output signal from the first chopper; and the second RF electrode coupled to the output signal from the second chopper.

Example 18. A method for plasma processing includes: sustaining a plasma in a plasma processing chamber, the plasma processing chamber including a first radio frequency (RF) electrode and a second RF electrode, where sustaining the plasma includes: coupling an RF source signal to the first RF electrode; and coupling a bias signal between the first RF electrode and the second RF electrode, the bias signal having a bipolar DC (B-DC) waveform being a difference of a first unipolar DC (U-DC) waveform and a second unipolar DC waveform, the polarity of the first U-DC waveform being same as the polarity of the second U-DC waveform, and where coupling the bias signal includes: coupling a first U-DC signal to the first RF electrode, the first U-DC signal having the first U-DC waveform including a first plurality of U-DC pulses, where each of the first plurality of U-DC pulses includes: a first U-DC pulse width during which the pulse has a first bias polarity relative to a reference potential; and a first U-DC pulse separation time during which the pulse has a neutral bias polarity substantially equal to the reference potential; coupling a second U-DC signal to the second RF electrode, the second U-DC signal having the second U-DC waveform including a second plurality of U-DC pulses, where each of the second plurality of U-DC pulses includes: a second U-DC pulse width during which the pulse has the first bias polarity relative to the reference potential and; a second U-DC pulse separation time during which the pulse has a neutral bias polarity substantially equal to the reference potential; and synchronizing the first U-DC signal with the second U-DC signal, where the synchronizing is delaying the U-DC pulses of the first U-DC signal by a constant U-DC delay time from the U-DC pulses of the second U-DC signal.

Example 19. The method of example 18, further including coupling a conductive portion of a wall of the plasma processing chamber to the reference potential.

Example 20. The method of one of examples 18 or 19, where the first bias polarity is a positive bias polarity relative to the reference potential.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method for plasma processing comprising:
sustaining a plasma in a plasma processing chamber, the plasma processing chamber comprising a first radio frequency (RF) electrode and a second RF electrode, wherein sustaining the plasma comprises:
coupling an RF signal source to the first RF electrode; and
applying a bias signal between the first RF electrode and the second RF electrode, the bias signal having a bipolar DC (B-DC) waveform comprising a plurality of B-DC pulses, each of the B-DC pulses comprising:
a negative bias duration during which the pulse has negative polarity relative to a reference potential,
a positive bias duration during which the pulse has positive polarity relative to the reference potential, and
a neutral bias duration during which the pulse has neutral polarity relative to the reference potential, wherein the bias signal has a B-DC-burst waveform comprising a train of B-DC-burst pulses, wherein each of the B-DC-burst pulses has a plurality of consecutive B-DC pulses that is present during a B-DC-burst duration followed by a B-DC-burst separation time during which there is no bias signal, a sum of the B-DC-burst duration and the B-DC-burst separation time being defined as a burst period.

2. The method of claim 1, further comprising coupling a conductive portion of walls of the plasma processing chamber to the reference potential.

3. The method of claim 1, further comprising:
coupling the second RF electrode to the reference potential; and
coupling a bias signal source to the first RF electrode, the bias signal source applying the bias signal.

4. The method of claim 1, further comprising:
coupling a bias signal source to the second RF electrode, the bias signal source applying the bias signal.

5. The method of claim 1, wherein the RF source signal source generates a continuous wave (CW) RF waveform and the bias signal has a continuous B-DC waveform, the continuous B-DC waveform comprising a continuous train of B-DC pulses.

6. The method of claim 1, wherein the neutral bias duration is split into a first neutral bias pulse segment and a second neutral bias pulse segment, the first neutral bias pulse segment separating the end of the negative bias duration from the start of a next positive bias duration, the second neutral bias pulse segment separating the end of the positive bias duration from the start of a next negative bias duration.

7. The method of claim 1, wherein the RF signal source generates a continuous wave (CW) RF waveform.

8. The method of claim 1,
wherein the RF signal source generates an RF-burst waveform comprising a train of RF-burst pulses, wherein each of the RF-burst pulses has an RF waveform that is present during an RF-burst duration followed by an RF-burst separation time during which there is no RF source signal;
wherein a sum of the RF-burst duration and the RF-burst separation time is equal to the burst period; and
wherein the method further comprises: synchronizing the B-DC-burst waveform with the RF-burst waveform, wherein the synchronizing is delaying the B-DC-burst pulses by a constant burst delay from the RF-burst pulses.

9. The method of claim 8,
wherein the RF-burst duration is greater than or equal to the B-DC-burst duration, and
wherein the burst delay is greater than or equal to zero and less than or equal to a difference between the RF burst duration and the B-DC-burst duration.

10. The method of claim 8,
wherein the B-DC burst duration is less than or equal to the RF burst separation time; and
wherein the burst delay is greater than or equal to the RF-burst duration and less than or equal to the B-DC-burst separation time.

11. The method of claim 8,
wherein the burst delay is greater than zero and less than or equal to the smaller of the RF-burst duration and the B-DC-burst separation time, and
wherein a sum of the burst delay and the B-DC-burst duration is greater than the RF-burst duration.

12. A system for plasma processing comprising:
a plasma processing chamber comprising:
  a first radio frequency (RF) electrode;
  a second RF electrode; and
  a substrate holder configured to hold a semiconductor substrate in the plasma processing chamber;
a processor;
a non-transitory memory storing a program to be executed in the processor, the program comprising:
  instructions to couple an RF signal source to the first RF electrode; and
  instructions to apply a bias signal between the first RF electrode and the second RF electrode, the bias signal having a bipolar DC (B-DC) waveform comprising a plurality of B-DC pulses, each of the B-DC pulses comprising:
    a negative bias duration during which the pulse has negative polarity relative to a reference potential,
    a positive bias duration during which the pulse has positive polarity relative to the reference potential, and
    a neutral bias duration during which the pulse has neutral polarity relative to the reference potential;
a continuous wave (CW) RF source signal source;
a programmable continuous B-DC bias signal source;
a programmable first chopper coupled to the CW-RF source signal source;
a programmable second chopper coupled to the continuous B-DC bias signal source; and
a timing controller coupled to the continuous B-DC bias signal source, the first chopper, and the second chopper, wherein the timing controller is configured to receive commands from the processor which, when executed, synchronously controls an output signal of the first chopper, an output signal of the second chopper and, and an output signal of the continuous B-DC bias signal source.

13. The system of claim 12, wherein a configuration of the system comprises:
the first RF electrode coupled to the output signal from the first chopper and the output signal from the second chopper; and
the second RF electrode coupled to the reference potential.

14. The system of claim 12, wherein a configuration of the system comprises:
the first RF electrode coupled to the output signal from the first chopper; and
the second RF electrode coupled to the output signal from the second chopper.

15. A method for plasma processing comprising:
sustaining a plasma in a plasma processing chamber, the plasma processing chamber comprising a first radio frequency (RF) electrode and a second RF electrode, wherein sustaining the plasma comprises:
  coupling an RF signal source to the first RF electrode; and
  applying a bias signal between the first RF electrode and the second RF electrode, the bias signal having a bipolar DC (B-DC) waveform being a difference of a first unipolar DC (U-DC) waveform and a second unipolar DC waveform, the polarity of the first U-DC waveform being same as the polarity of the second U-DC waveform, and wherein applying the bias signal comprises:
    coupling applying a first U-DC signal to the first RF electrode, the first U-DC signal having the first U-DC waveform comprising a first plurality of U-DC pulses, wherein each of the first plurality of U-DC pulses comprises:
      a first U-DC pulse width during which the pulse has a first bias polarity relative to a reference potential; and
      a first U-DC pulse separation time during which the pulse has a neutral bias polarity substantially equal to the reference potential;
    applying a second U-DC signal to the second RF electrode, the second U-DC signal having the second U-DC waveform comprising a second plurality of U-DC pulses, wherein each of the second plurality of U-DC pulses comprises:
      a second U-DC pulse width during which the pulse has the first bias polarity relative to the reference potential and;
      a second U-DC pulse separation time during which the pulse has a neutral bias polarity substantially equal to the reference potential; and
    synchronizing the first U-DC signal with the second U-DC signal, wherein the synchronizing is delaying the U-DC pulses of the first U-DC signal by a constant U-DC delay time from the U-DC pulses of the second U-DC signal.

16. The method of claim 15, further comprising coupling a conductive portion of a wall of the plasma processing chamber to the reference potential.

17. The method of claim 15, wherein the first bias polarity is a positive bias polarity relative to the reference potential.

* * * * *